US012660606B2

(12) United States Patent
Kim et al.

(10) Patent No.: US 12,660,606 B2
(45) Date of Patent: Jun. 16, 2026

(54) SEMICONDUCTOR DEVICE AND DATA STORAGE SYSTEMS INCLUDING A SEMICONDUCTOR DEVICE

(71) Applicant: SAMSUNG ELECTRONICS CO., LTD., Suwon-si (KR)

(72) Inventors: Jiwon Kim, Suwon-si (KR); Jiyoung Kim, Suwon-si (KR); Woosung Yang, Suwon-si (KR); Sukkang Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 464 days.

(21) Appl. No.: 18/239,504

(22) Filed: Aug. 29, 2023

(65) Prior Publication Data

US 2024/0203875 A1     Jun. 20, 2024

(30) Foreign Application Priority Data

Dec. 16, 2022     (KR) ........................ 10-2022-0177465

(51) Int. Cl.
*H01L 23/52*          (2006.01)
*G11C 16/04*          (2006.01)
          (Continued)

(52) U.S. Cl.
CPC ...... *H01L 23/5283* (2013.01); *G11C 16/0483* (2013.01); *H01L 25/0652* (2013.01);
          (Continued)

(58) Field of Classification Search
CPC ..... H01L 23/5283; H10B 41/10; H10B 43/35; H10B 41/35; H10B 80/00; H10B 43/10; H10B 43/27; H10B 41/27
          (Continued)

(56) References Cited

U.S. PATENT DOCUMENTS 9,564,451 B1     2/2017   Shin et al.
9,698,153 B2     7/2017   Liu et al.
                 (Continued)

FOREIGN PATENT DOCUMENTS

| CN | 112805833 | | 5/2021 | | |
| CN | 115472620 A | * | 12/2022 | ......... | H01L 23/5283 |
| WO | 2022133990 | | 6/2022 | | |

OTHER PUBLICATIONS

Search Report issued by the European Patent Office in corresponding application No. EP 23215568.9 on May 21, 2024.

*Primary Examiner* — Phuc T Dang
(74) *Attorney, Agent, or Firm* — Morgan, Lewis & Bockius LLP

(57)          ABSTRACT

A semiconductor device including a first semiconductor structure overlapping a second semiconductor structure, the second semiconductor structure having first and second regions and including a plate layer; gate electrodes spaced apart from each other in a first direction; channel structures passing through the gate electrodes; gate separation regions extending in a second direction; first and second upper isolation regions dividing an upper gate electrode into first, second and third sub-gate electrodes between adjacent gate separation regions; and contact plugs extending in the first direction, each of the first and second upper isolation regions has a region extending in a third direction, and the first sub-gate electrode has a first pad region having a first width and a second pad region having a second width narrower than the first width in a fourth direction, and the first sub-gate electrode is connected to one of the contact plugs.

20 Claims, 23 Drawing Sheets

(51) Int. Cl.

| | |
|---|---|
| *H01L 23/528* | (2006.01) |
| *H01L 25/065* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |
| *H10B 80/00* | (2023.01) |

(52) U.S. Cl.
CPC ............. *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 80/00* (2023.02); *H01L 2225/06506* (2013.01)

(58) Field of Classification Search
USPC ........................................................ 257/734
See application file for complete search history.

(56) References Cited

U.S. PATENT DOCUMENTS

| | | | |
|---|---|---|---|
| 10,381,081 | B2 | 8/2019 | Sugisaki et al. |
| 10,943,919 | B2 | 3/2021 | Kobayashi et al. |
| 11,239,247 | B2 | 2/2022 | Sun et al. |
| 2019/0252396 | A1 | 8/2019 | Mushiga et al. |
| 2020/0194373 | A1 | 6/2020 | Baek et al. |
| 2022/0084910 | A1 | 3/2022 | Karyu et al. |
| 2022/0231038 | A1 | 7/2022 | Baek et al. |

* cited by examiner

SEMICONDUCTOR DEVICE AND DATA STORAGE SYSTEMS INCLUDING A SEMICONDUCTOR DEVICE

CROSS-REFERENCE TO RELATED APPLICATION(S)

This application claims priority under 35 U.S.C. § 119 to Korean Patent Application No. 10-2022-0177465 filed on Dec. 16, 2022 in the Korean Intellectual Property Office, the disclosure of which is incorporated by reference herein in its entirety.

TECHNICAL FIELD

The present disclosure relates to a semiconductor device and a data storage system including the same.

DISCUSSION OF RELATED ART

In electronic systems that necessitate data storage, there is a growing demand for semiconductor devices capable of storing large amounts of data. Accordingly, research has focused on developing methods to increase the data storage capacity of semiconductor devices. For example, one approach involves semiconductor devices with memory cells arranged three-dimensionally, as opposed to the two-dimensional arrangement. This approach enables higher data storage capacity within the semiconductor device.

SUMMARY

An embodiment of the present disclosure provides a semiconductor device having enhanced mass productivity.

Another embodiment of the present disclosure provides a data storage system including a semiconductor device having enhanced mass productivity.

According to an embodiment of the present disclosure, there is provided a semiconductor device including: a first semiconductor structure including a substrate, circuit elements on the substrate, and circuit interconnection lines connected to the circuit elements; and a second semiconductor structure on the first semiconductor structure, the second semiconductor structure having first and second regions, wherein the second semiconductor structure includes: a plate layer; gate electrodes stacked on the plate layer and spaced apart from each other in a first direction, perpendicular to an upper surface of the plate layer, the gate electrodes including a lower gate electrode, memory gate electrodes, and an upper gate electrode sequentially stacked, and the gate electrodes having pad regions extending to different lengths in a second direction, perpendicular to the first direction, in the second region such that upper surfaces of the pad regions are exposed; channel structures, in the first region, the channel structures passing through the gate electrodes, extending in the first direction, and each including a channel layer; gate separation regions, in the first and second regions, the gate separation regions passing through the gate electrodes and extending in the second direction; first and second upper isolation regions on the memory gate electrodes, the first and second upper isolation regions dividing the upper gate electrode into first, second and third sub-gate electrodes between adjacent gate separation regions, and extending in the second direction; and contact plugs, in the second region, the contact plugs extending in the first direction through the pad regions of the gate electrodes, and connected to portions of the circuit interconnection lines, each of the first and second upper isolation regions has a region extending in a third direction, intersecting the second direction, and the first sub-gate electrode has a first pad region having a first width and a second pad region having a second width narrower than the first width in a fourth direction, perpendicular to the second direction, and the first sub-gate electrode is connected to one of the contact plugs in the first pad region.

According to an embodiment of the present disclosure, there is provided a semiconductor device including: a first semiconductor structure including a substrate, circuit elements on the substrate, and circuit interconnection lines connected to the circuit elements; and a second semiconductor structure on the first semiconductor structure and having first and second regions, wherein the second semiconductor structure includes: a plate layer; gate electrodes stacked on the plate layer and spaced apart from each other in a first direction, perpendicular to an upper surface of the plate layer, and having pad regions extending to different lengths in a second direction, perpendicular to the first direction, in the second region such that upper surfaces of the pad regions are exposed; gate separation regions, in the first and second regions, passing through the gate electrodes and extending in the second direction; an upper isolation region on portions of the gate electrodes, dividing an uppermost gate electrode, among the gate electrodes, into first and second sub-gate electrodes between the gate separation regions, and extending in the second direction; and contact plugs, in the second region, extending in the first direction through the gate electrodes and connected to portions of the circuit interconnection lines, the upper isolation region has a region extending in a third direction, intersecting the second direction, the first sub-gate electrode has first and second pad regions having different sizes, and the second sub-gate electrode has third and fourth pad regions having different sizes, and the first sub-gate electrode is connected to one of the contact plugs in the first pad region, and the second sub-gate electrode is connected to one of the contact plugs in the fourth pad region.

According to an embodiment of the present disclosure, there is provided a data storage system including: a semiconductor storage device including a first semiconductor structure including circuit elements, a second semiconductor structure including channel structures and having first and second regions, and an input/output pad electrically connected to the circuit elements; and a controller electrically connected to the semiconductor storage device via the input/output pad and configured to control the semiconductor storage device, wherein the second semiconductor structure further includes: gate electrodes stacked and spaced apart from each other in a first direction, the gate electrodes including a lower gate electrode, memory gate electrodes, and an upper gate electrode sequentially stacked, and having pad regions extending to different lengths in a second direction, perpendicular to the first direction, in the second region such that upper surfaces of the pad regions are exposed; gate separation regions, in the first and second regions, passing through the gate electrodes and extending in the second direction; first and second upper isolation regions on the memory gate electrodes, dividing the upper gate electrode into first, second and third sub-gate electrodes between adjacent gate separation regions, and extending in the second direction; and contact plugs, in the second region, extending in the first direction through the pad regions of the gate electrodes and connected to portions of the circuit interconnection lines, and the first and second upper isolation regions have regions extending in a third direction, intersecting the second direction, and being symmetrical to each other in a fourth direction, perpendicular to the second direction.

BRIEF DESCRIPTION OF DRAWINGS

The above and other features of the present disclosure will be more clearly understood from the following detailed description, taken in conjunction with the accompanying drawings, in which.

DETAILED DESCRIPTION OF THE EMBODIMENTS

Hereinafter, example embodiments of the present disclosure will be described below with reference to the accompanying drawings.

Figure 1:
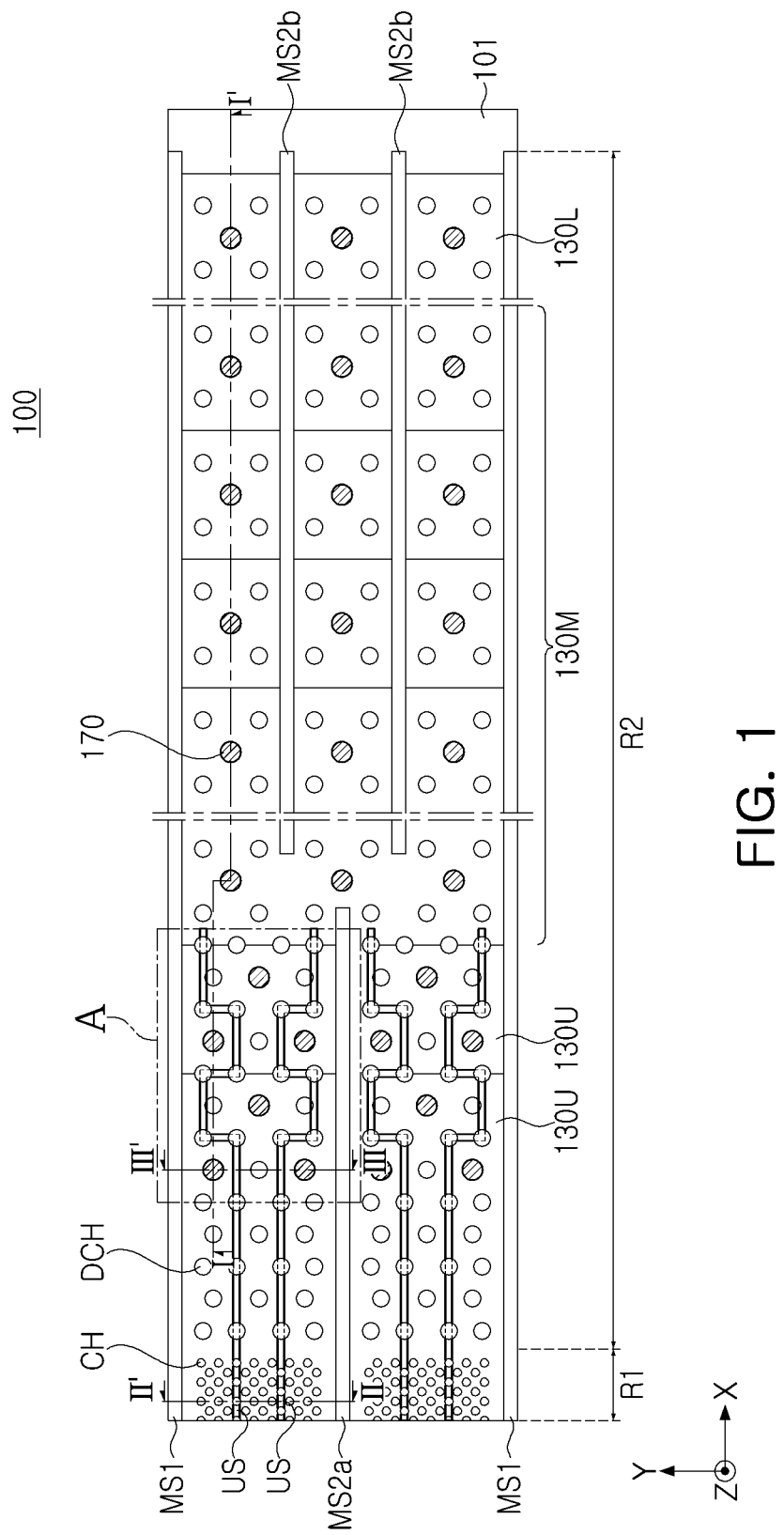
FIG. 1 is a schematic plan view of a semiconductor device according to example embodiments of the present disclosure.

FIG. 1 is a schematic plan view of a semiconductor device according to example embodiments.

Figure 2A:
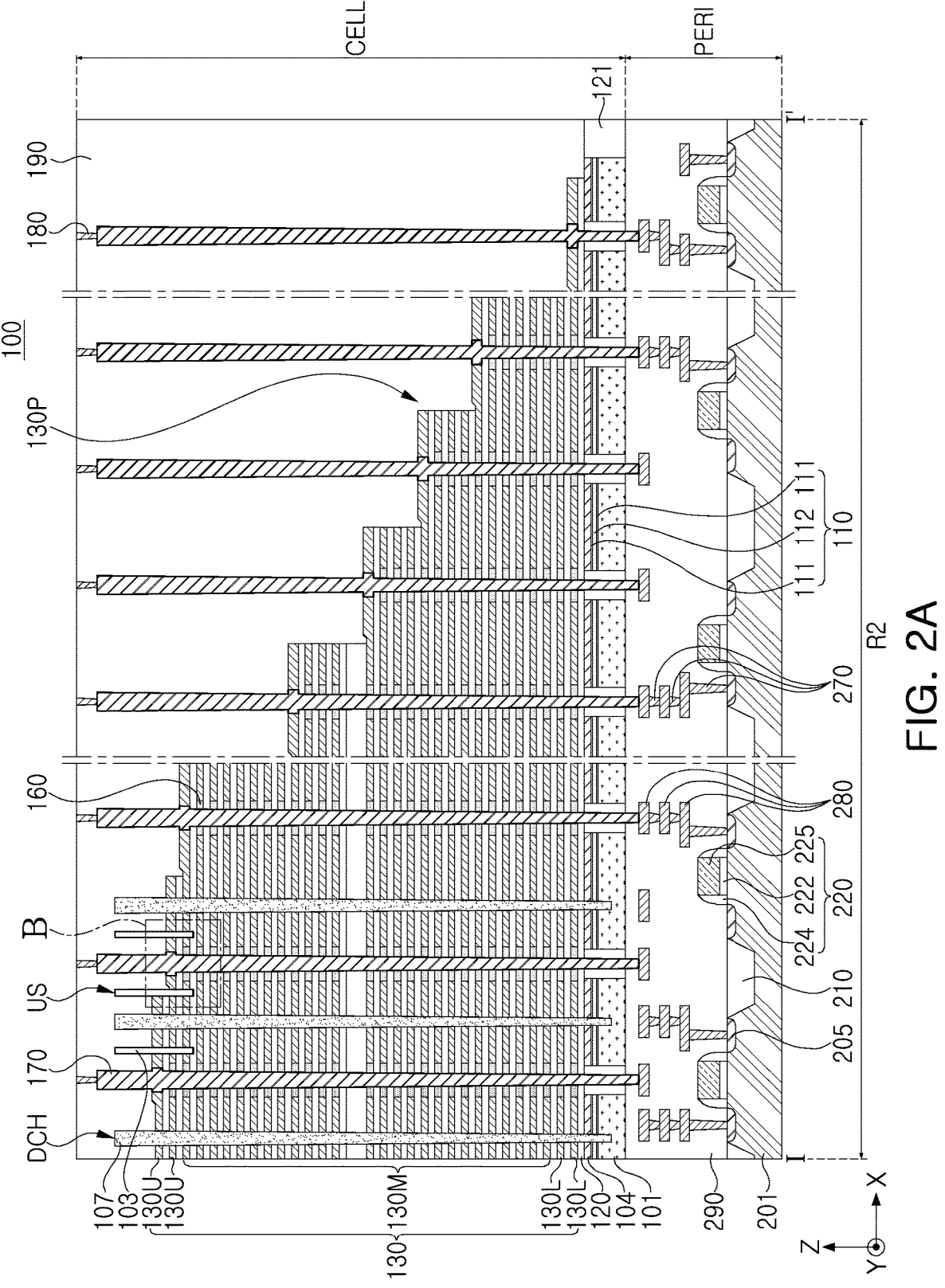
FIGS. 2A, 2B and 2C are schematic cross-sectional views of a semiconductor device according to example embodiments of the present disclosure.
Figure 2B:
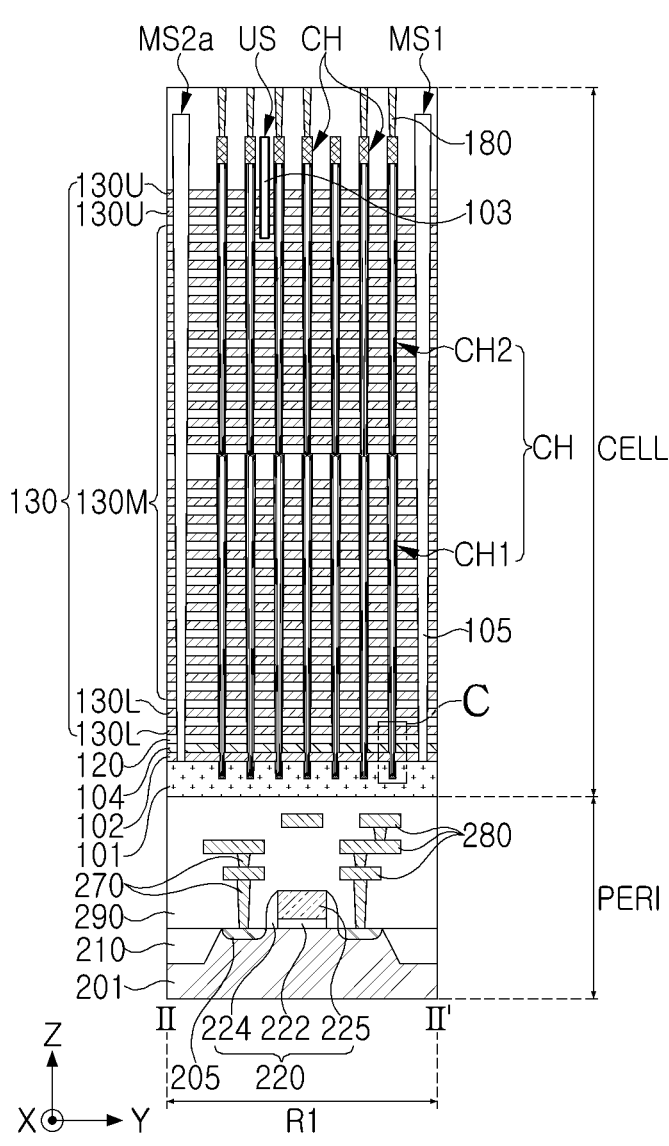
Figure 2C:
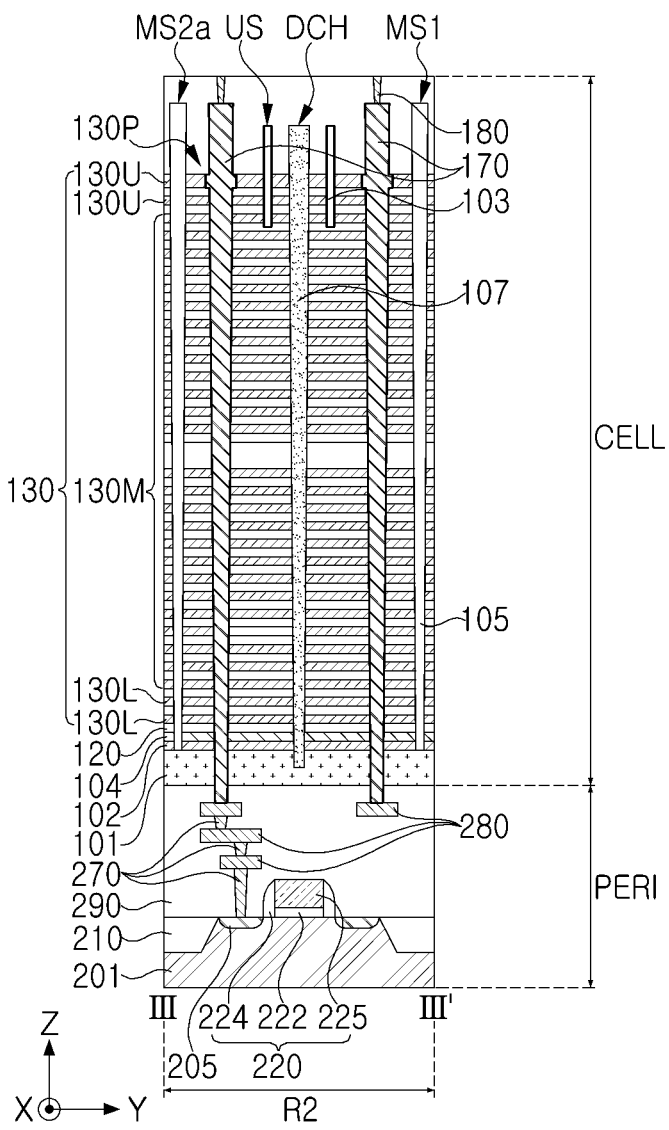

FIGS. 2A to 2C are schematic cross-sectional views of a semiconductor device according to example embodiments. FIGS. 2A to 2C illustrate cross-sections taken along lines I-I', II-II', and III-III' of FIG. 1, respectively.

Figure 3A:
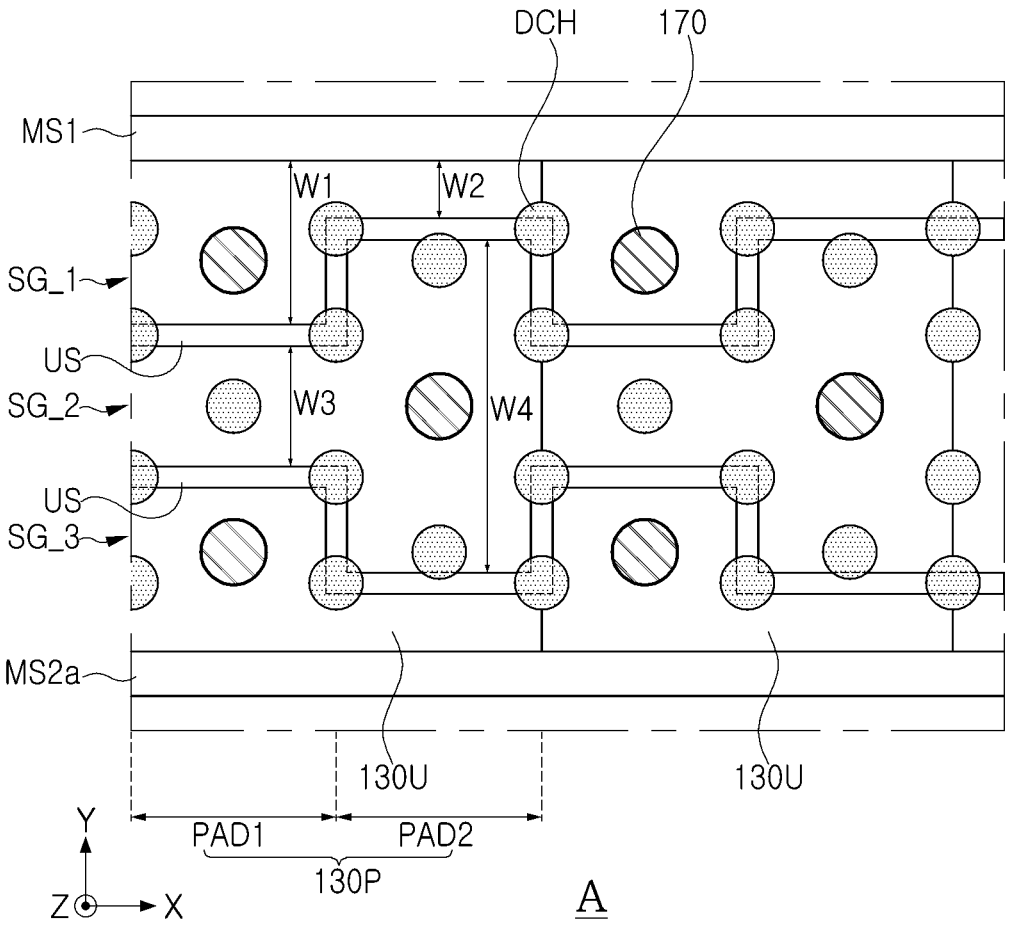
FIGS. 3A, 3B and 3C are schematic partially enlarged views of portions of a semiconductor device according to example embodiments of the present disclosure.
Figure 3B:
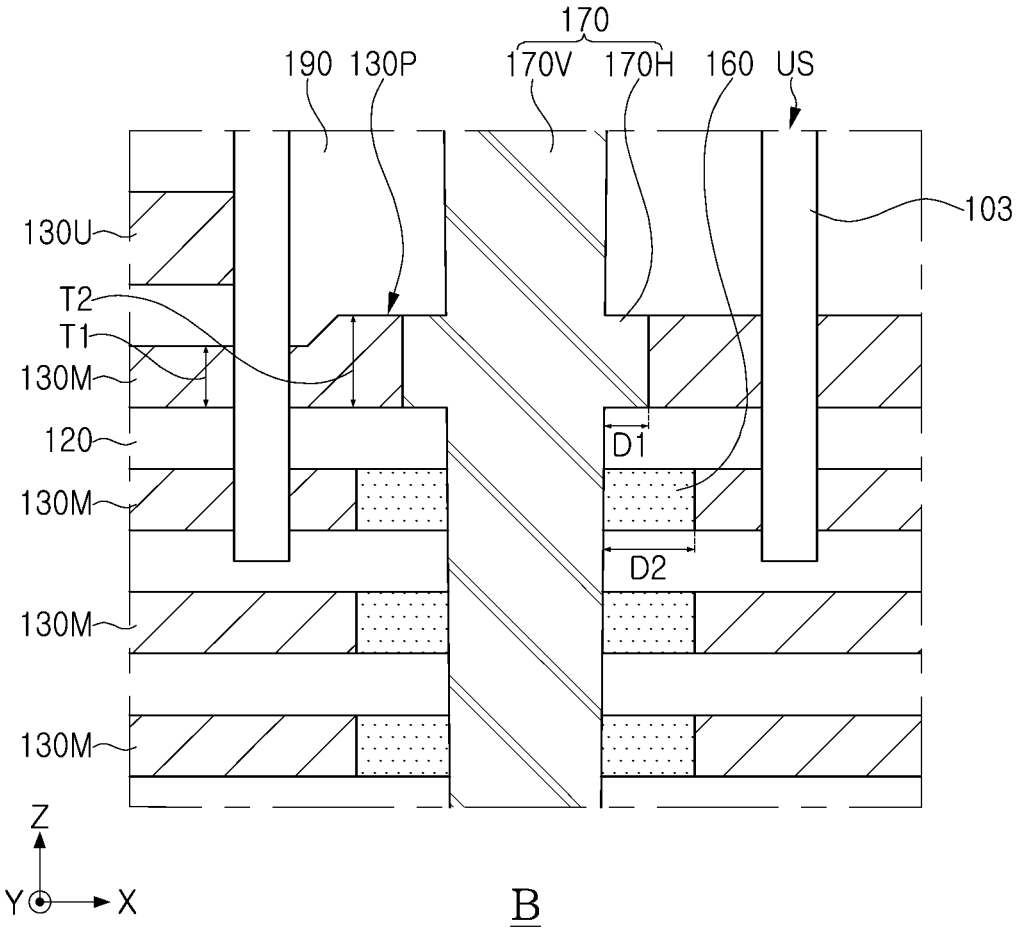
Figure 3C:
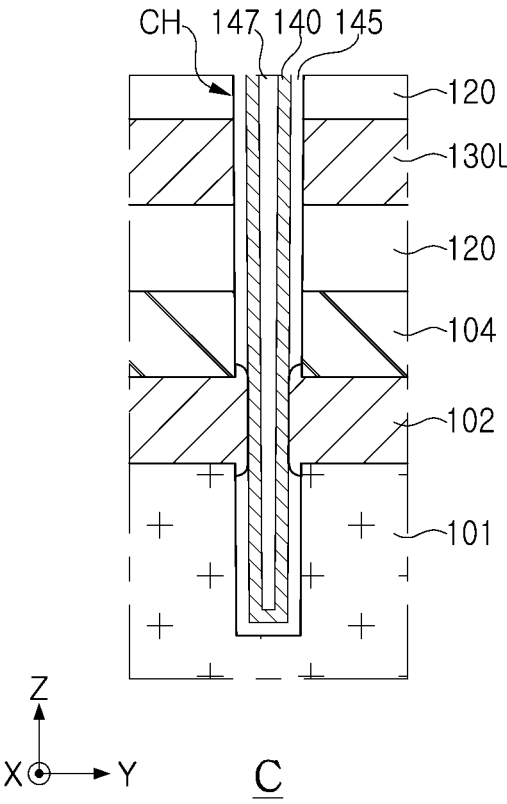

FIGS. 3A to 3C are schematic partially enlarged views of portions of a semiconductor device according to example embodiments. FIG. 3A is an enlarged view of region "A" of FIG. 1, FIG. 3B is an enlarged view of region "B" of FIG. 2A, and FIG. 3C is an enlarged view of region "C" of FIG. 2B.

Referring to FIGS. 1 to 3C, a semiconductor device 100 may include a peripheral circuit region PERI, a first semiconductor structure including a substrate 201, a memory cell region CELL, and a second semiconductor structure including a plate layer 101. The memory cell region CELL may be disposed on the peripheral circuit region PERI. Conversely, in example embodiments, the memory cell region CELL may be disposed below the peripheral circuit region PERI.

The peripheral circuit region PERI may include the substrate 201, impurity regions 205 and element isolation layers 210 in the substrate 201, circuit elements 220 disposed on the substrate 201, a peripheral region insulating layer 290, circuit contact plugs 270, and circuit interconnection lines 280.

The substrate 201 may have an upper surface extending in an X-direction and a Y-direction. In the substrate 201, an active region may be defined by the element isolation layers 210. The impurity regions 205 including impurities may be disposed in a portion of the active region. The substrate 201 may include a semiconductor material, such as a group IV semiconductor, a group III-V compound semiconductor, or a group II-VI compound semiconductor. The substrate 201 may be provided as a bulk wafer or an epitaxial layer.

The circuit elements 220 may include a planar transistor. Each of the circuit elements 220 may include a circuit gate dielectric layer 222, a spacer layer 224, and a circuit gate electrode 225. On both sides of the circuit gate electrode 225, the impurity regions 205 may be disposed as source/drain regions within the substrate 201.

On the substrate 201, the peripheral region insulating layer 290 may be disposed on the circuit element 220. The peripheral region insulating layer 290 may include a plurality of insulating layers formed in different processes. The peripheral region insulating layer 290 may be formed of an insulating material.

The circuit contact plugs 270 and the circuit interconnection lines 280 may form a circuit interconnection structure electrically connected to the circuit elements 220 and the impurity regions 205. The circuit contact plugs 270 may have a cylindrical shape, and the circuit interconnection lines 280 may have a linear shape. An electrical signal may be applied to the circuit element 220 by the circuit contact plugs 270 and the circuit interconnection lines 280. The circuit contact plugs 270 may also be connected to the circuit gate electrode 225. The circuit interconnection lines 280 may be connected to the circuit contact plugs 270, have a linear shape, and may be disposed in a plurality of layers. The circuit contact plugs 270 and the circuit interconnection lines 280 may include a conductive material, for example, tungsten (W), copper (Cu), aluminum (Al), and the like, and respective components may further include a diffusion barrier. In example embodiments, the number of layers of the circuit contact plugs 270 and the circuit interconnection lines 280 may be changed in various manners.

The memory cell region CELL may have first and second regions R1 and R2, and may include the plate layer 101, gate electrodes 130 stacked on the plate layer 101, interlayer insulating layers 120 stacked alternately with each other, channel structures CH disposed to pass through a stack structure of gate electrodes 130 in the first region R1, first and second gate separation regions MS1, MS2a, and MS2b extending through the stack structure of the gate electrodes 130, upper isolation regions US passing through portions of the gate electrodes 130, and contact plugs 170 connected to pad regions 130P of the gate electrodes 130 and vertically extending in the second region R2. The memory cell region CELL may further include first and second horizontal conductive layers 102 and 104 disposed below the gate electrodes 130 in the first region R1, a horizontal insulating layer 110 disposed below the gate electrodes 130 together with the second horizontal conductive layer 104 in the second region R2, substrate insulating layers 121 disposed to pass through the plate layer 101, support structures DCH disposed to pass through the stack structure of the gate electrodes 130 in the second region R2, the channel structures CH and upper plugs 180 on the contact plugs 170, and a cell region insulating layer 190 covering the gate electrodes 130.

In the memory cell region CELL, the first region R1, a region in which the gate electrodes 130 are vertically stacked and the channel structures CH are disposed, may be a region in which memory cells are disposed. The second region R2, a region in which the gate electrodes 130 extend to different lengths, may be a region for electrically connecting the memory cells to the peripheral circuit region PERI. The second region R2 may be disposed near at least one end of the first region R1 in at least one direction, for example, the X-direction.

The plate layer 101 may be in the form of a plate, and may function as at least a portion of a common source line of the semiconductor device 100. The plate layer 101 may have an upper surface extending in the X-direction and the Y-direction. The plate layer 101 may include a conductive material. For example, the plate layer 101 may include a semiconductor material, such as a group IV semiconductor, a group III-V compound semiconductor, or a group II-VI compound semiconductor. For example, the group IV semiconductor may include silicon, germanium, or silicon-germanium. The plate layer 101 may further include impurities. The plate layer 101 may be provided as a polycrystalline semiconductor layer such as a polycrystalline silicon layer or an epitaxial layer.

The first and second horizontal conductive layers 102 and 104 may be disposed on the upper surface of the plate layer 101 to be sequentially stacked in the first region R1. The first horizontal conductive layer 102 may not extend to the second region R2, and the second horizontal conductive layer 104 may extend to the second region R2. The first horizontal conductive layer 102 may function as a portion of a common source line of the semiconductor device 100, and may function as a common source line together with the plate layer 101, for example. As illustrated in FIG. 3C, the first horizontal conductive layer 102 may be directly connected to a channel layer 140 on a circumference of the channel layer 140. For example, sides of the horizontal conductive layer 102 may be directly connected to the channel layer 140. The second horizontal conductive layer 104 may be in contact with the plate layer 101 in portions of the second region R2 where the first horizontal conductive layer 102 and the horizontal insulating layer 110 are not disposed.

The first and second horizontal conductive layers 102 and 104 may include a semiconductor material, for example, polycrystalline silicon. In this case, at least the first horizontal conductive layer 102 may be a layer doped with conductivity-type impurities the same as that of the plate layer 101, and the second horizontal conductive layer 104 may be a doped layer or may be a layer including impurities diffused from the first horizontal conductive layer 102. However, the material of the second horizontal conductive layer 104 is not limited to a semiconductor material, and may be replaced with an insulating layer.

The horizontal insulating layer 110 may be disposed on the plate layer 101 on a level the same as that of the first horizontal conductive layer 102 in at least a portion of the second region R2. The horizontal insulating layer 110 may include first and second horizontal insulating layers 111 and 112 alternately stacked on the second region R2 of the plate layer 101. The horizontal insulating layer 110 may be layers remaining after a portion of the horizontal insulating layer 110 is replaced with the first horizontal conductive layer 102 in a process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of a material the same as that of the interlayer insulating layers 120, and the second horizontal insulating layer 112 may be formed of a material different from that of the interlayer insulating layers 120.

The substrate insulating layers 121 may be disposed to pass through the plate layer 101, the horizontal insulating layer 110, and the second horizontal conductive layer 104 in a portion of the second region R2. The substrate insulating layers 121 may be further disposed in the first region R1, and may be disposed, for example, in a region where a through-via extending from the memory cell region CELL to the peripheral circuit region PERI is disposed. An upper surface of the substrate insulating layer 121 may be coplanar with an upper surface of the second horizontal conductive layer 104. The substrate insulating layer 121 may include an insulating material such as silicon oxide, silicon nitride, silicon carbide, or silicon oxynitride.

The gate electrodes 130 may be stacked on the plate layer 101 to be vertically spaced apart from each other to form a stack structure together with the interlayer insulating layers 120. The stack structure may include lower and upper stack structures vertically stacked. However, in some example embodiments, the stack structure may be formed of a single stack structure.

The gate electrodes 130 may include lower gate electrodes 130L forming a gate of a ground selection transistor, memory gate electrodes 130M forming a plurality of memory cells, and upper gate electrodes 130U forming gates of string selection transistors. The number of memory gate electrodes 130M forming memory cells may be determined depending on a capacity of the semiconductor device 100. In some example embodiments, the number of upper and lower gate electrodes 130U and 130L may be one to four or more, and the upper and lower gate electrodes 130U and 130L may have a structure the same as or different from that of the memory gate electrodes 130M. In example embodiments, the gate electrodes 130 may further include a gate electrode 130 disposed on upper portions of the upper gate electrodes 130U and/or lower portions of the lower gate electrodes 130L. This gate electrode 130 may be an erase transistor used for an erase operation using a gate induced drain leakage (GIDL) phenomenon. In addition, portions of gate electrodes 130, for example, memory gate electrodes 130M, adjacent to the upper or lower gate electrodes 130U and 130L, may be dummy gate electrodes.

As illustrated in FIG. 1, the gate electrodes 130 may be isolated from each other in the Y-direction by the first gate separation regions MS1 consecutively extending in the first region R1 and the second region R2. The gate electrodes 130 between a pair of first gate separations regions MS1 may form one memory block, but the range of the memory block is not limited thereto. Portions of the gate electrodes 130, for example, the memory gate electrodes 130M, may each form one layer within one memory block.

The gate electrodes 130 may be stacked on the first region R1 and the second region R2 to be vertically spaced apart from each other, and may extend to different lengths from the first region R1 to the second region R2 to form a step structure that is in the form of a stair (or staircase) in a portion of the second region R2. The gate electrodes 130 may be disposed to have a step structure in the Y-direction as well. Due to the step structure, the gate electrodes 130 may each have regions with upper surfaces upwardly exposed from the interlayer insulating layers 120 and other gate electrodes 130 due to a lower gate electrode 130 extending to be longer than an upper gate electrode 130, and these regions may be referred to as the pad regions 130P. In each gate electrode 130, the pad region 130P may be a region including an end of the gate electrode 130 in the X-direction. The gate electrodes 130 may be respectively connected to the contact plugs 170 in the pad regions 130P. The gate electrodes 130 may have an increased thickness in the pad regions 130P. As illustrated in FIG. 3B, the gate electrodes 130 may extend to have a first thickness T1 and to have a second thickness T2 greater than the first thickness T1 in the pad regions 130P. The thickness of the gate electrodes 130 may be measured in a Z-direction.

The gate electrodes 130 may include a metal material, for example, tungsten (W). In some example embodiments, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN), titanium nitride (TIN), or combinations thereof.

The interlayer insulating layers 120 may be disposed between the gate electrodes 130. In the same manner as the gate electrodes 130, the interlayer insulating layers 120 may be spaced apart from each other in a direction perpendicular to the upper surface of the plate layer 101, and to extend in the X-direction. The interlayer insulating layers 120 may include an insulating material such as silicon oxide or silicon nitride.

The channel structures CH each may form one memory cell string, and may be spaced apart from each other while forming rows and columns on the plate layer 101 in the first region R1. In an X-Y plane, the channel structures CH may be disposed to form a lattice pattern or to have a zigzag shape in one direction. The channel structures CH may have a columnar shape and have inclined side surfaces becoming narrower as a distance to the plate layer 101 decreases. Among the channel structures CH, the channel structures CH overlapping the upper isolation regions US may be dummy channels that do not actually function as memory cell strings. In some example embodiments, at least portions of the channel structures CH disposed at an end of the first region R1 may also be dummy channels.

The channel structures CH may include first and second channel structures CH1 and CH2 vertically stacked. The first channel structure CH1 may be disposed between the second channel structure CH2 and the substrate 210. The channel structures CH may have a form in which the lower first channel structures CH1 and the upper second channel structures CH2 are connected to each other, and may have a bent portion due to a difference in width in a connection region. However, in some example embodiments, the number of channel structures stacked in a Z-direction may be changed in various manners.

Each of the channel structures CH may include a channel layer 140, a gate dielectric layer 145, a channel filling insulating layer 147, and a channel pad disposed in a channel hole. As illustrated in the enlarged view in FIG. 2B, the channel layer 140 may have an annular shape surrounding the inner channel filling insulating layer 147. However, in some example embodiments, the channel layer 140 may have a columnar shape such as a cylindrical shape or a prismatic shape, without the channel filling insulating layer 147. The channel layer 140 may be connected to the first horizontal conductive layer 102 therebelow. For example, sides of the horizontal conductive layer 102 may make direct contact with the channel layer 140. The channel layer 140 may include a semiconductor material such as polycrystal-line silicon or single-crystalline silicon.

The gate dielectric layer 145 may be disposed between the gate electrodes 130 and the channel layer 140. The gate dielectric layer 145 may include a tunneling layer, a charge storage layer, and a blocking layer sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or combinations thereof. In example embodiments, at least a portion of the gate dielectric layer 145 may extend in a horizontal direction along the gate electrodes 130.

The channel pad may be disposed only at an upper end of the lower second channel structure CH2. The channel pad may include, for example, doped polycrystalline silicon.

The channel layer 140, the gate dielectric layer 145, and the channel filling insulating layer 147 may be connected to each other between the first channel structure CH1 and the second channel structure CH2. A relatively thick interlayer insulating layer 120 may be disposed between the first channel structure CH1 and the second channel structure CH2. However, in example embodiments, the thickness of each of the interlayer insulating layers 120 may be changed in various manners.

The support structures DCH may be spaced apart from each other while forming rows and columns on the plate layer 101 in the second region R2. As illustrated in FIG. 1, the support structures DCH may be disposed to respectively surround the contact plugs 170. However, in example embodiments, the specific arrangement of the support structures DCH may be changed in various manners. The support structures DCH may be dummy structures that do not perform an electrical function within the semiconductor device 100. The support structures DCH may have a column-nar shape, and may have inclined side surfaces becoming narrower as a distance to the plate layer 101 decreases. The ends of the support structures DCH may be provided in the plate layer 101.

The support structures DCH may have a circular shape, an elliptical shape, or a shape similar thereto in an X-Y plane. A diameter or maximum width of the support structures DCH may be greater than that of the channel structures CH, but the present disclosure is not limited thereto. The support structures DCH may have an internal structure different from that of the channel structures CH. For example, the support structures DCH may not include a conductive layer, and the support structures DCH each may include a support insulating layer 107 formed of an insulating material. The support insulating layer 107 may include, for example, silicon oxide, silicon nitride, or silicon oxynitride. However, in some example embodiments, at least portions of the support structures DCH may have an internal structure the same as that of the channel structures CH.

The first and second gate separation regions MS1, MS2a, and MS2b may be disposed to pass through the gate elec-trodes 130 and extend in the X-direction. As illustrated in FIG. 1, the first and second gate separation regions MS1, MS2a, and MS2b may be parallel to each other. The first and second gate separation regions MS1, MS2a, and MS2b may pass through all of the gate electrodes 130 stacked on the plate layer 101 and further pass through the first and second horizontal conductive layers 102 and 104 and the horizontal insulating layer 110 to be connected to the plate layer 101. The first gate separation regions MS1 may extend as one in the X-direction, and the second gate separation regions MS2a and MS2b may be disposed only in a region between the pair of first isolation regions MS1. For example, second central gate separation regions MS2a may be disposed in the first region R1 and a portion of the second region R2, adjacent to the first region R1, and second auxiliary gate separation regions MS2b may be disposed only in the second region R2. The second auxiliary gate separation regions MS2b may intermittently extend in the X-direction. However, in example embodiments, the arrangement and number of the first and second gate separation regions MS1, MS2a, and MS2b are not limited to those illustrated in FIG. 1.

A gate isolation insulating layer 105 may be disposed on each of the first and second gate separation regions MS1, MS2a, and MS2b. The gate isolation insulating layer 105 may have a shape having a width decreasing toward the plate layer 101 due to a high aspect ratio. The gate isolation insulating layer 105 may include an insulating material, for example, silicon oxide, silicon nitride, or silicon oxynitride.

As illustrated in FIG. 1, the upper isolation regions US may be disposed between the first gate separation region MS1 and the second central gate separation region MS2a, adjacent to each other, in the first region R1, and may extend to a portion of the second region R2. Each of the upper isolation regions US may extend in the X-direction as well as other directions. The upper isolation regions US may extend only in the X-direction in the first region R1, and may have regions extending in a direction, intersecting the X-direction, for example, in the Y-direction, in a portion of the second region R2, adjacent to the first region R1. Accordingly, the upper isolation regions US may have bent portions. The upper isolation regions US may have regions extending in the Y-direction from a region passing through the pad regions 130P of the upper gate electrodes 130U in the second region R2. In other words, in the pad regions 130P of the upper gate electrodes 130U, the extension directions of the upper isolation regions US may change. For example, the upper isolation regions US may have regions having a zigzag shape or a square sawtooth shape in a plan view.

The upper isolation regions US may overlap portions of the channel structures CH in the first region R1 and may overlap portions of the support structures DCH in the second region R2. In overlapping regions, the upper isolation regions US may be replaced with the channel structures CH and the support structures DCH, but the present disclosure is not limited thereto, and may be changed depending on the order of the formation of the upper isolation regions US. For example, when the upper isolation regions US are formed last, the upper isolation regions US may be disposed to recess upper regions of the channel structures CH and the support structures DCH.

The upper isolation regions US may pass through portions of the gate electrodes 130, including an uppermost upper gate electrode 130U, among the gate electrodes 130. The upper isolation regions US may be disposed on the memory gate electrodes 130M and not pass through the memory gate electrodes 130M. Accordingly, lower ends of the upper isolation regions US may be positioned on a level higher than that of uppermost surfaces of the memory gate electrodes 130M. Alternatively, when portions of the memory gate electrodes 130M form a dummy gate electrode, the upper isolation regions US may pass through an upper dummy gate electrode, among the memory gate electrodes 130M. The lower ends of the upper isolation regions US may be positioned between two gate electrodes 130, vertically adjacent to each other. Below the upper isolation regions US, the memory gate electrodes 130M and the lower gate electrodes 130L may overlap the upper isolation regions US in the Z-direction, and may horizontally extend. The upper isolation regions US may isolate a total of three gate electrodes 130 from each other in the Y-direction, for example. However, in example embodiments, the number of gate electrodes 130 isolated by the upper isolation regions US may be changed in various manners.

Each of the upper isolation regions US may include an upper isolation insulating layer 103. The upper isolation insulating layer 103 may include an insulating material, for example, silicon oxide, silicon nitride, or silicon oxynitride.

As illustrated in FIG. 3A, in the present example embodiment, two upper isolation regions US may be disposed between the first gate separation region MS1 and the second central gate separation region MS2a, adjacent to each other in the Y-direction. Accordingly, between the first gate separation region MS1 and the second center gate separation region MS2a, each of the upper gate electrodes 130U may be divided into first, second and third sub-gate electrodes SG_1, SG_2, and SG_3. The first to third sub-gate electrodes SG_1, SG_2, and SG_3, divided from one upper gate electrode 130U, may be positioned on the same level, and may have the same length in the X-direction. The first to third sub-gate electrodes SG_1, SG_2, and SG_3 may be spaced apart from each other in the Y-direction. The first to third sub-gate electrodes SG_1, SG_2, and SG_3 may have different shapes.

Each of the upper isolation regions US may have regions extending in the Y-direction. Due to the shape of the upper isolation regions US, the pad region 130P of each of the upper gate electrodes 130U may have first and second pad regions PAD1 and PAD2, different from each other in size, for example, different planar areas. Each of the upper isolation regions US may have a region extending in the Y-direction between the first pad region PAD1 and the second pad region PAD2, and may further have a region extending in the Y-direction from at least one end of the pad region 130P in the X-direction Hereinafter, as illustrated in FIG. 3A, more detailed descriptions will be provided based on the uppermost upper gate electrode 130U.

Each of the three first to third sub-gate electrodes SG_1, SG_2, and SG_3 of the upper gate electrode 130U may include first and second pad regions PAD1 and PAD2 sequentially disposed from the first region R1. In the first to third sub-gate electrodes SG_1, SG_2, and SG_3, the first pad regions PAD1 may be disposed to be parallel to each other in the Y-direction, and the second pad regions PAD2 may be disposed to be parallel to each other in the Y-direction. The first and second pad regions PAD1 and PAD2 of the second sub-gate electrode SG_2 may be referred to as third and fourth pad regions to distinguish the first and second pad regions PAD1 and PAD2 of the second sub-gate electrode SG_2 from the first and second pad regions PAD1 and PAD2 of the first sub-gate electrode SG_1.

In each of the first to third sub-gate electrodes SG_1, SG_2, and SG_3, the first pad region PAD1 and the second pad region PAD2 may have different sizes. In the first sub-gate electrode SG1, a size of the first pad region PAD1 may be larger than that of the second pad region PAD2. For example, the first and second pad regions PAD1 and PAD2 have the same length in the X-direction, the first pad region PAD1 may have a first width W1 in the Y-direction, and the second pad region PAD1 may have a second width W2 narrower than the first width W1 in the Y-direction. The second width W2 is narrower than the first width W1 because the upper isolation region US in the second pad region PAD2 is closer to the first gate separation region MS1 than the upper isolation region US in the first pad region PAD1.

In the second sub-gate electrode SG2, the size of the first pad region PAD1 may be smaller than that of the second pad region PAD2. For example, the first and second pad regions PAD1 and PAD2 may have the same length in the X-direction, the first pad region PAD1 may have a third width W3 in the Y-direction, and the second pad region PAD2 may have a fourth width W4 wider than the third width W3 in the Y-direction. The fourth width W4 may be wider than the first width W1, and the size of the second pad region PAD2 of the second sub-gate electrode SG2 may be larger than the size of the first pad region PAD1 of the first sub-gate electrode SG1, but the present disclosure is not limited thereto.

The two upper isolation regions US may have shapes symmetrical to each other in the Y-direction. Accordingly, as in the first sub-gate electrode SG1, the size of the first pad region PAD1 may be larger than that of the second pad region PAD2 in the third sub-gate electrode SG3.

Each of the first to third sub-gate electrodes SG_1, SG_2, and SG_3 may be connected to the contact plug 170 in a relatively large pad region. Each of the first and third sub-gate electrodes SG1 and SG3 may be connected to the contact plug 170 in the first pad region PAD1, and the second sub-gate electrode SG2 may be connected to the contact plug 170 in the second pad region PAD2. At least portions of the contact plugs 170, passing through the first to third sub-gate electrodes SG_1, SG_2, and SG_3, may not overlap each other in the Y-direction. The contact plugs 170, passing through the first to third sub-gate electrodes SG_1, SG_2, and SG_3, may not overlap each other in the X-direction, but the present disclosure is not limited thereto. The support structures DCH may be disposed on circumferences of the contact plugs 170 to pass through the first and second pad regions PAD1 and PAD2. For example, the support structures DCH may be disposed around the contact plugs 170.

The contact plugs 170 may be connected to pad regions 130P of uppermost gate electrodes 130 in the second region R2. The contact plugs 170 may pass through at least a portion of the cell region insulating layer 190, and may be connected to each of the pad regions 130P of the gate electrodes 130 upwardly exposed. The contact plugs 170 may pass through the gate electrodes 130 below the pad regions 130P and pass through the horizontal insulating layer 110, the second horizontal conductive layer 104, and the plate layer 101 to be connected to the circuit interconnection lines 280 in the peripheral circuit region PERI. The contact plugs 170 may be spaced apart from the gate electrodes 130 below the pad regions 130P by contact insulating layers 160. The contact plugs 170 may be spaced apart from the plate layer 101, the horizontal insulating layer 110, and the second horizontal conductive layer 104 by the substrate insulating layers 121.

As illustrated in FIG. 3B, each of the contact plugs 170 may have a shape horizontally extending from the pad region 130P. The contact plug 170 may include a vertical extension 170V extending in the Z-direction and a horizontal extension 170H horizontally extending from the vertical extension 170V to be in contact with the gate electrode 130. The horizontal extension 170H may be disposed along a circumference of the vertical extension 170V, and may extend to have a first dimension D1 from a side surface of the vertical extension 170V to an end of the horizontal extension 170H. The first dimension D1 may be smaller than a second dimension D2 from the side surface of the vertical extension portion 170V to outer surfaces of the contact insulating layers 160. The contact plugs 170 may be spaced apart from the gate electrodes 130 below the pad regions 130P, in other words, the gate electrodes 130 that are not electrically connected, by the contact insulating layers 160. More specifically, the contact plugs 170 are separated from the gate electrodes 130 by the contact insulating layers 160 below the pad regions 130P.

The contact plugs 170 may include a conductive material, for example, at least one of tungsten (W), copper (Cu), aluminum (Al), and alloys thereof. In some example embodiments, the contact plugs 170 may include a barrier layer extending along a side surface and a bottom surface, or may have an air gap therein.

In the semiconductor device 100, the upper gate electrode 130U may have a relatively narrow width in the Y-direction as compared to the memory gate electrodes 130M, and accordingly, may not be easily connected to the contact plug 170 having the horizontal extension 170H without defects. However, in the semiconductor device 100 according to the present example embodiment, due to the form of the upper isolation regions US, the pad region 130P of the upper gate electrode 130U may have regions having different widths in the Y-direction, as described above, and may be connected to the contact plugs 170 in a region in which the upper gate electrode 130U has a relatively wide width. Accordingly, an interconnection structure of the semiconductor device 100 may be simplified, thereby enhancing mass productivity and reliability.

The contact insulating layers 160 may be disposed to surround side surfaces of each of the contact plugs 170. The contact insulating layers 160 may be spaced apart from each other in the Z-direction on a circumference of each of the contact plugs 170. The contact insulating layers 160 may be disposed on a level substantially the same as that of the gate electrodes 130. The contact insulating layers 160 may include an insulating material, for example, silicon oxide, silicon nitride, or silicon oxynitride.

The upper plugs 180 may form a cell interconnection structure electrically connected to memory cells in the memory cell region CELL. The upper plugs 180 may be connected to the channel structures CH and the contact plugs 170, and may be electrically connected to the channel structures CH and the gate electrodes 130. The shape of the upper plugs 180 is illustrated as a plug shape, but the present disclosure is not limited thereto, and may have a linear shape. In example embodiments, the number of plugs and interconnection lines forming the cell interconnection structure may be changed in various manners. The upper plugs 180 may include metal, for example, tungsten (W), copper (Cu), aluminum (Al), and the like.

The cell region insulating layer 190 may be disposed to cover the stack structure of the gate electrodes 130, the contact plugs 170, the substrate insulating layer 121, and the like. The cell region insulating layer 190 may be formed of an insulating material or may be formed of a plurality of insulating layers.

Figure 4A:
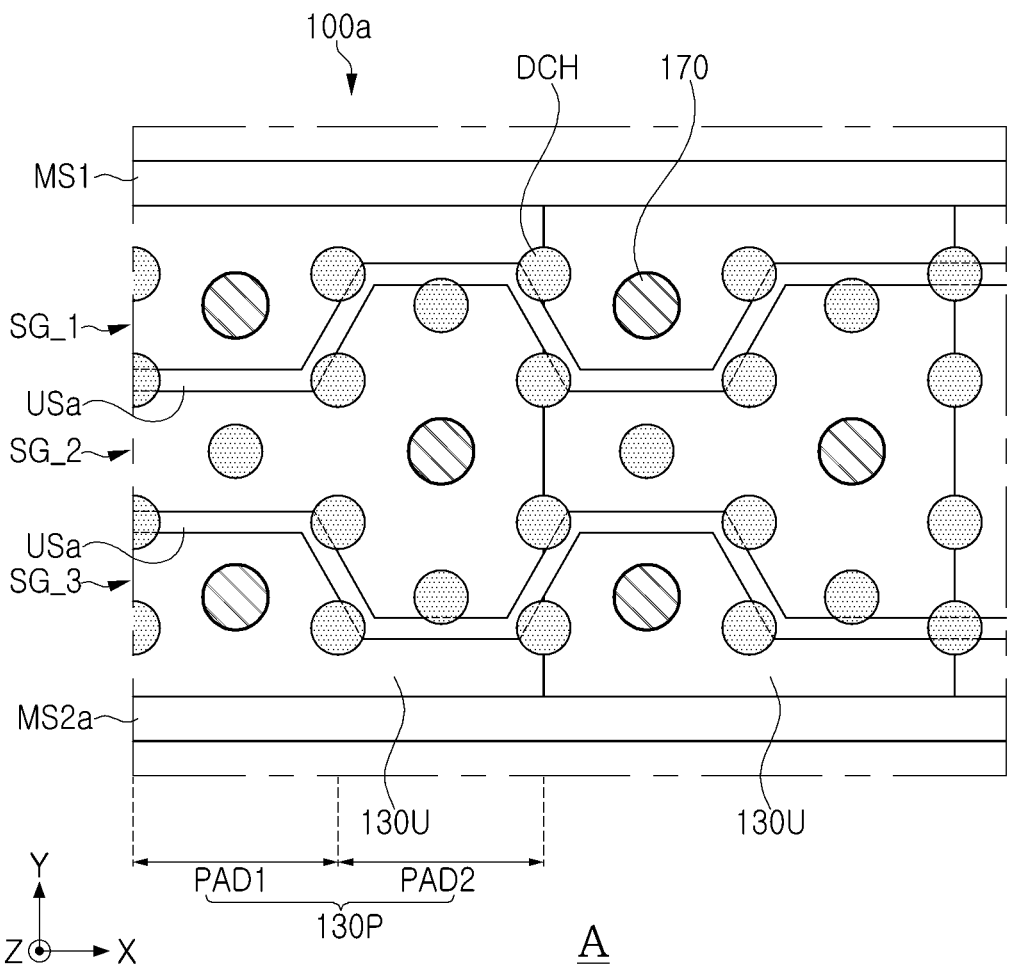
FIGS. 4A, 4B and 4C are schematic partially enlarged views of a semiconductor device according to example embodiments of the present disclosure.
Figure 4B:
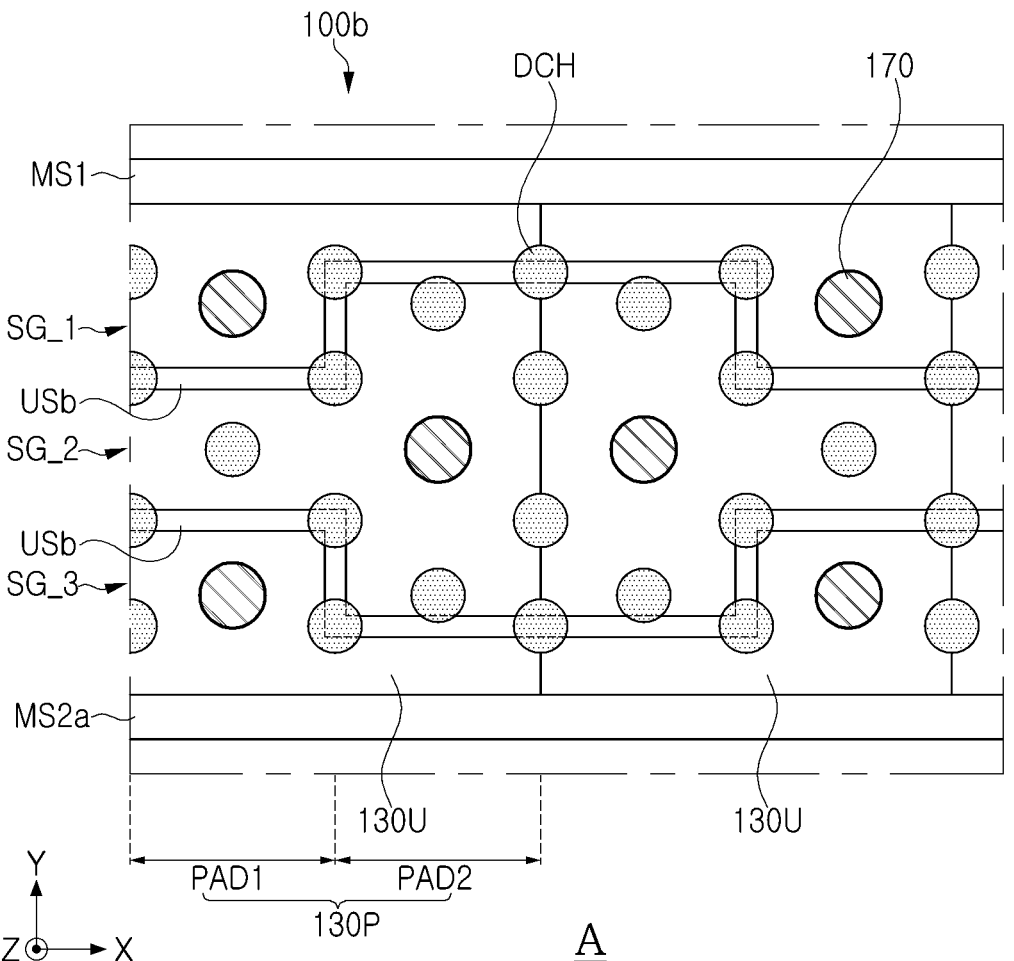
Figure 4C:
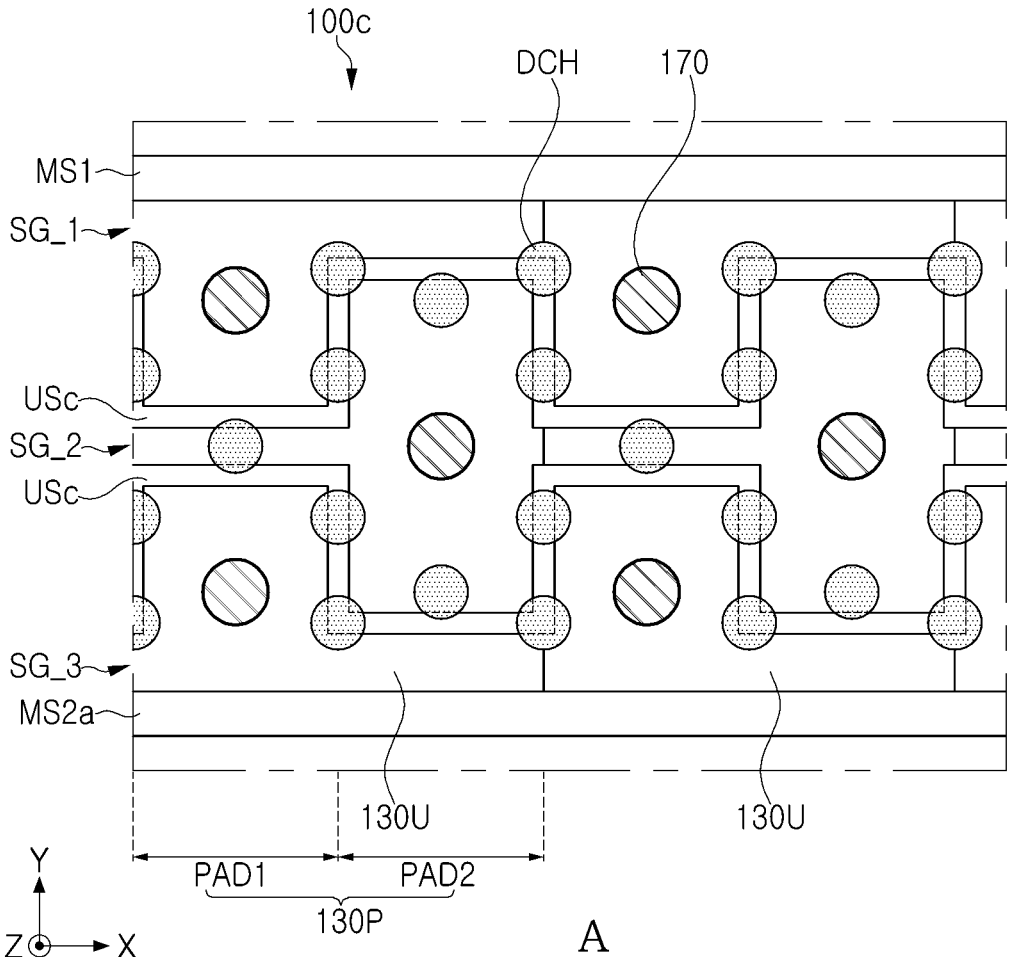

FIGS. 4A to 4C are schematic partially enlarged views of a semiconductor device according to example embodiments. FIGS. 4A to 4C each illustrate a region corresponding to FIG. 3A.

Referring to FIG. 4A, in a semiconductor device 100_a_, an upper isolation region USa may have regions extending in a direction between an X-direction and a Y-direction. The direction may be inclined to the X-direction and the Y-direction. For example, the direction of the upper isolation region USa may be slanted. In example embodiments, an angle formed by the direction and the X-direction or the Y-direction may be changed in various manners. Even in this case, due to the upper isolation regions USa, a pad region 130P of each of upper gate electrodes 130U may have first and second pad regions PAD1 and PAD2 having different planar areas.

Referring to FIG. 4B, in a semiconductor device 100_b_, an upper isolation region USb may have a region extending in a Y-direction only between a first pad region PAD1 and a second pad region PAD2. The upper isolation region USb may not have a region extending in the Y-direction at an end of a pad region 130P in an X-direction. Accordingly, in a plan view, the upper isolation region USb may extend to have a straight linear shape from the second pad region PAD2 of an uppermost upper gate electrode 130U to an upper gate electrode 130U therebelow.

Referring to FIG. 4C, in a semiconductor device 100_c_, an upper isolation region USc may have a region extending in a Y-direction between a first pad region PAD1 and a second pad region PAD2, and may further have regions extending in the Y-direction at both ends of a pad region 130P in an X-direction. In the present example embodiment, lengths of the regions of the upper isolation region USc extending in the Y-direction at the both ends of the pad region 130P may be different from each other. However, in example embodiments, relative lengths of the regions of the upper isolation region USc may be changed in various manners.

Figure 5:
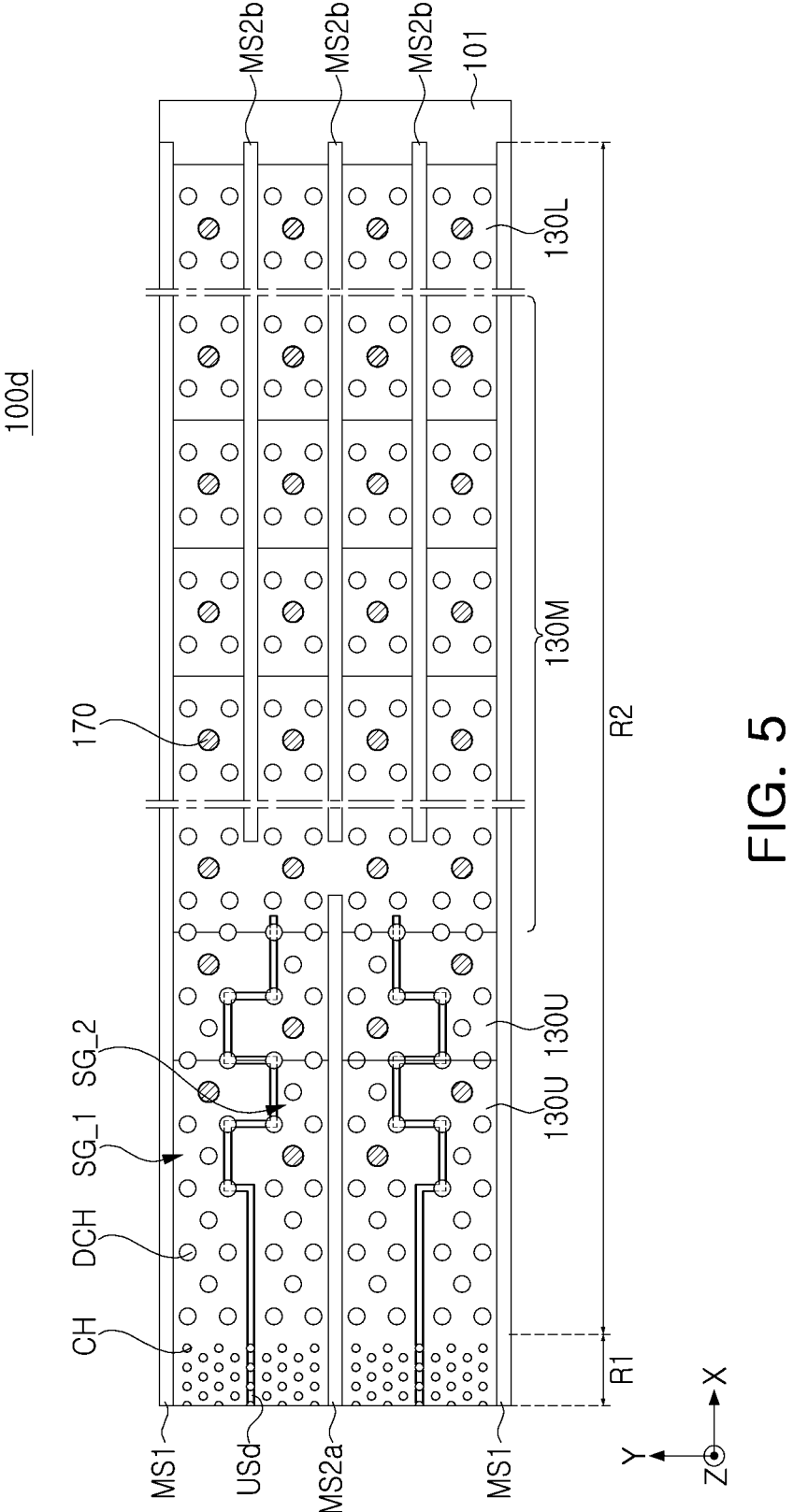
FIG. 5 is a schematic plan view of a semiconductor device according to example embodiments of the present disclosure.

FIG. 5 is a schematic plan view of a semiconductor device according to example embodiments.

Referring to FIG. 5, in a semiconductor device 100_d_, the arrangement of channel structures CH, first and second gate separation regions MS1, MS2_a_, and MS2_b_, and upper isolation regions USd may be different from that in the example embodiment of FIG. 1.

In the present example embodiment, one upper isolation region USd may be disposed between the first gate separation region MS1 and the second central gate separation region MS2_a_, adjacent to each other, in a Y-direction. Accordingly, each of upper gate electrodes 130U may be divided into two sub-gate electrodes SG_1 and SG_2 between the first gate separation region MS1 and the second central gate separation region MS2_a_. Also in the present example embodiment, due to the form of the upper isolation region USd, the pad region 130P of the upper gate electrode 130U may include pad regions having different planar areas, and may be connected to the contact plug 170 in a relatively large pad region. In other words, a large pad region for connecting with the contact plug 170 may be provided by this embodiment.

Thus, in example embodiments, the number of upper isolation regions USd disposed between adjacent gate separation regions MS1, MS2_a_, and MS2_b_ may be changed in various manners.

Figure 6:
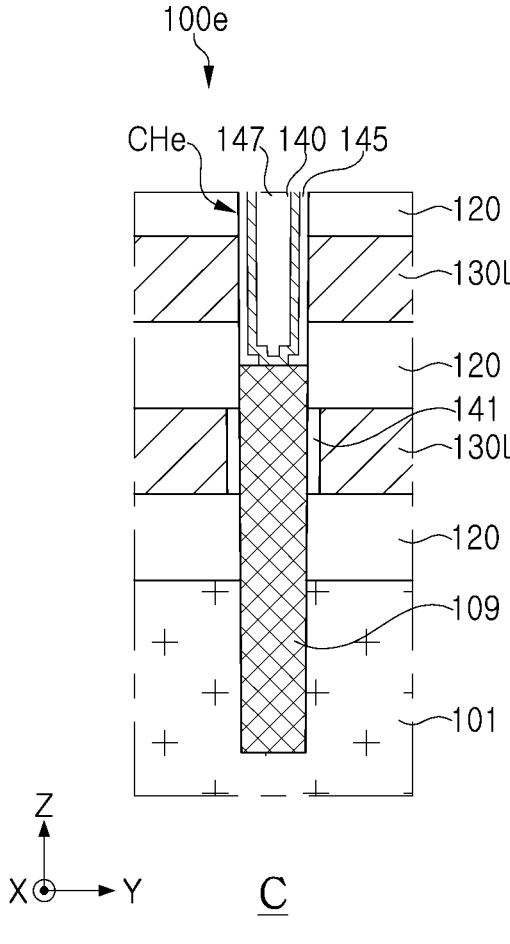
FIG. 6 is a schematic partially enlarged view of a semiconductor device according to example embodiments of the present disclosure.

FIG. 6 is a schematic partially enlarged view of a semiconductor device according to example embodiments. FIG. 6 illustrates a region corresponding to FIG. 3C.

Referring to FIG. 6, in a semiconductor device 100_e_, the memory cell region CELL may not include first and second horizontal conductive layers 102 and 104 on a plate layer 101, unlike the example embodiment of FIG. 2B. For example, the plate layer 101 may be in direct contact with an interlayer insulating layer 120. In addition, a channel structure CHe may further include an epitaxial layer 109.

The epitaxial layer 109 may be disposed on the plate layer 101 at a lower end of the channel structure CHe, and may form a source structure together with the plate layer 101. The epitaxial layer 109 may be disposed on a side surface of at least one lower gate electrode 130L. The epitaxial layer 109 may be disposed in a region in which the plate layer 101 is recessed. An upper surface of the epitaxial layer 109 may be higher than an upper surface of a lowermost lower gate electrode 130L, and may be lower than a lower surface of a lower gate electrode 130L thereabove, but the present disclosure is not limited thereto. The epitaxial layer 109 may be connected to a channel layer 140 via an upper surface thereof. A gate insulating layer 141 may be further disposed between the epitaxial layer 109 and an adjacent lower gate electrode 130L.

The form of the channel structure CHe may also be applied to other example embodiments.

Figure 7:
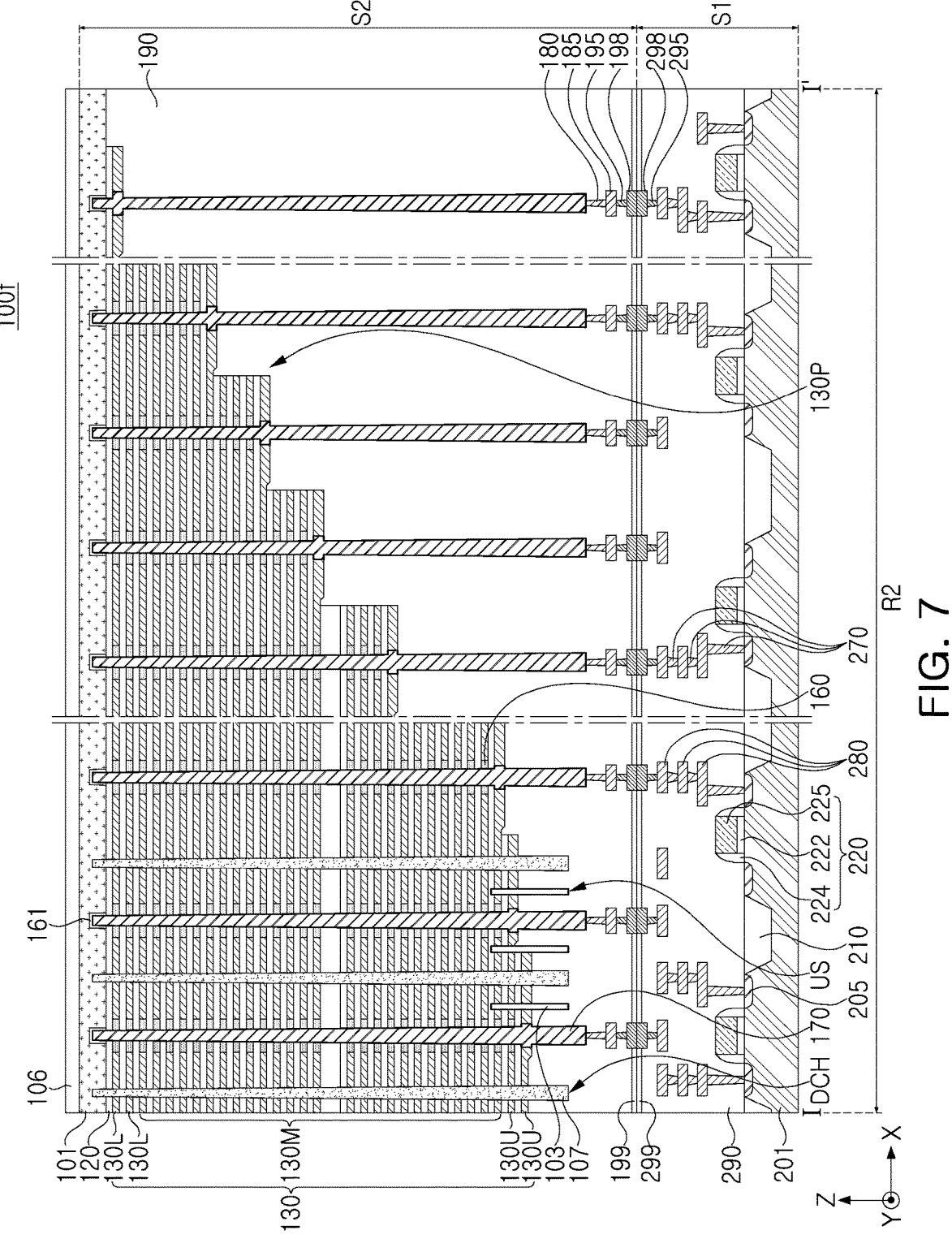
FIG. 7 is a schematic cross-sectional view of a semiconductor device according to example embodiments of the present disclosure.

FIG. 7 is a schematic cross-sectional view of a semiconductor device according to example embodiments.

Referring to FIG. 7, a semiconductor device 100_f_ may include a first semiconductor structure S1 and a second semiconductor structure S2 bonded to each other using a wafer bonding method.

The description of the peripheral circuit region PERI described above with reference to FIGS. 1 to 3C may be applied to the first semiconductor structure S1. However, the first semiconductor structure S1 may further include first bonding vias 295, first bonding metal layers 298, and a first bonding insulating layer 299, which are bonding structures. The first bonding vias 295 may be disposed on upper portions of uppermost circuit interconnection lines 280 to be connected to the circuit interconnection lines 280. At least portions of the first bonding metal layers 298 may be connected to the first bonding vias 295 on the circuit connection lines 280. The first bonding metal layers 298 may be connected to second bonding metal layers 198 of the second semiconductor structure S2. The first bonding metal layers 298 may provide an electrical connection path according to bonding between the first semiconductor structure S1 and the second semiconductor structure S2, together with the second bonding metal layers 198. Portions of the first bonding metal layers 298 may be disposed only for bonding without being connected to lower circuit interconnection lines 280. The first bonding vias 295 and the first bonding metal layers 298 may include a conductive material, such as copper (Cu). The first bonding insulating layer 299 may be disposed on circumferences of the first bonding metal layers 298. The first bonding insulating layer 299 may also function as a diffusion barrier of the first bonding metal layers 298, and may include, for example, at least one of SiN, SiON, SiCN, SiOC, SiOCN, and SiO.

The description of the memory cell region CELL described above with reference to FIGS. 1 to 3C may be applied to the second semiconductor structure S2, unless otherwise described. The second semiconductor structure S2 may further include cell interconnection lines 185, which are cell interconnection structures, and may further include second bonding vias 195, second bonding metal layers 198, and second bonding insulating layer 199, which are bonding structures. The second semiconductor structure S2 may further include upper insulating layers 161 disposed between a passivation layer 106 and contact plugs 170, covering an upper surface of a plate layer 101, and the plate layer 101.

The cell interconnection lines 185 may be connected to upper plugs 180. However, in example embodiments, the number of layers and the arrangement of plugs and interconnection lines forming a cell interconnection structure may be changed in various manners. The cell interconnection lines 185 may be formed of a conductive material, and may include, for example, at least one of tungsten (W), aluminum (Al), and copper (Cu).

The second bonding vias 195 and the second bonding metal layers 198 may be disposed below the lowermost cell interconnection lines 185. The second bonding vias 195 may connect the cell interconnection lines 185 and the second bonding metal layers 198, and the second bonding metal layers 198 are bonded to the first bonding metal layer 298 of the first semiconductor structure S1. In other words, the second bonding metal layers 198 and the first bonding metal layer 298 are directly coupled to each other. The second bonding insulating layer 199 may be bonded and connected to the first bonding insulating layer 299 of the first semiconductor structure S1. In other words, the second bonding insulating layer 199 and the first bonding insulating layer 299 are directly coupled to each other. The second bonding vias 195 and the second bonding metal layers 198 may include a conductive material, such as copper (Cu). The second bonding insulating layer 199 may include, for example, at least one of SiO, SiN, SICN, SIOC, SiON, and SiOCN.

The first and second semiconductor structures S1 and S2 may be bonded to each other by bonding between the first bonding metal layers 298 and the second bonding metal layers 198 and bonding between the first bonding insulating layer 299 and the second bonding insulating layer 199. The bonding between the first bonding metal layers 298 and the second bonding metal layers 198 may be, for example, copper (Cu)-to-copper (Cu) bonding. The bonding between the first bonding insulating layer 299 and the second bonding insulating layer 199 may be dielectric-to-dielectric bonding, such as SiCN-to-SiCN bonding, for example. The first and second semiconductor structures S1 and S2 may be bonded to each other by hybrid bonding including copper (Cu)-to-copper (Cu) bonding and dielectric-to-dielectric bonding.

FIGS. 8A to 8G are schematic cross-sectional views illustrating a method of manufacturing a semiconductor device according to example embodiments. FIGS. 8A to 8G each illustrate a cross-section corresponding to FIG. 2A.

Figure 8A:
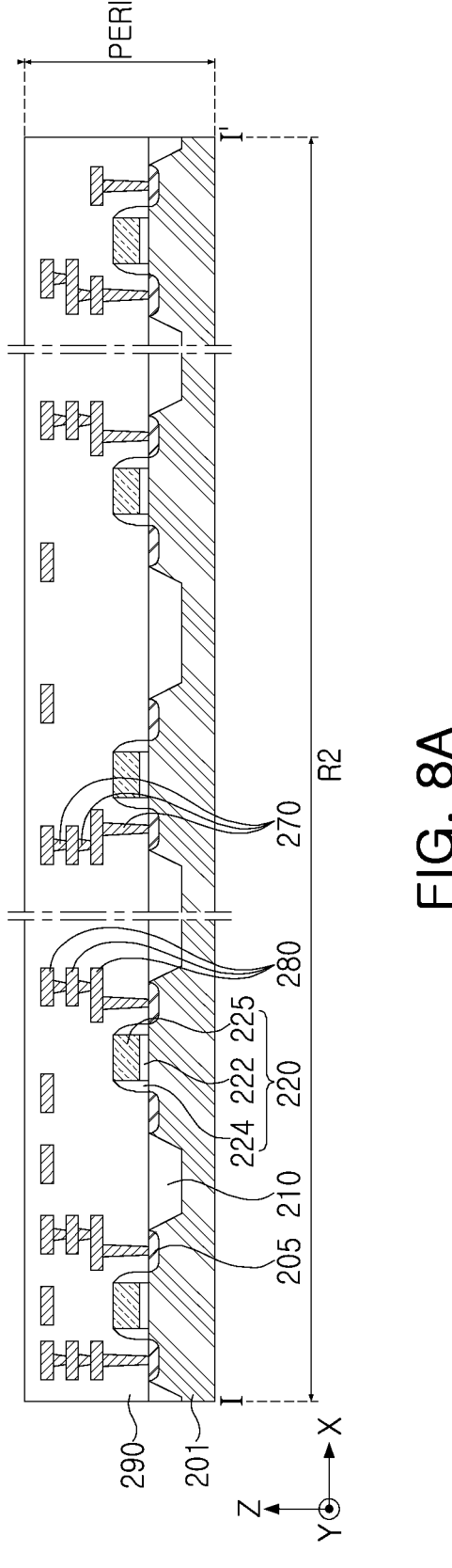
FIGS. 8A, 8B, 8C, 8D, 8E, 8F and 8G are schematic cross-sectional views illustrating a method of manufacturing a semiconductor device according to example embodiments of the present disclosure.

Referring to FIG. 8A, circuit elements 220 forming a peripheral circuit region PERI, a circuit interconnection structure, and a peripheral region insulating layer 290 may be formed on a substrate 201.

First, element isolation layers 210 may be formed in the substrate 201, and a circuit gate dielectric layer 222 and a circuit gate electrode 225 may be sequentially formed on the substrate 201. The element isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but the present disclosure is not limited thereto. Subsequently, a spacer layer 224 and impurity regions 205 may be formed on both sidewalls of the circuit gate dielectric layer 222 and the circuit gate electrode 225. In some example embodiments, the spacer layer 224 may include a plurality of layers. Subsequently, the impurity regions 205 may be formed by performing an ion implantation process.

Circuit contact plugs 270 of the circuit interconnection structure may be formed by forming a portion of the peripheral region insulating layer 290, etching and removing the portion of the peripheral region insulating layer 290, and filling the removed portion of the peripheral region insulating layer 290 with a conductive material. The circuit interconnection lines 280 may be formed by, for example, depositing a conductive material and then patterning the deposited conductive material.

The peripheral region insulating layer 290 may include a plurality of insulating layers. The peripheral region insulating layer 290 may be a portion used in respective operations of forming the circuit interconnection structure. As a result, the peripheral circuit region PERI may be formed.

Figure 8B:
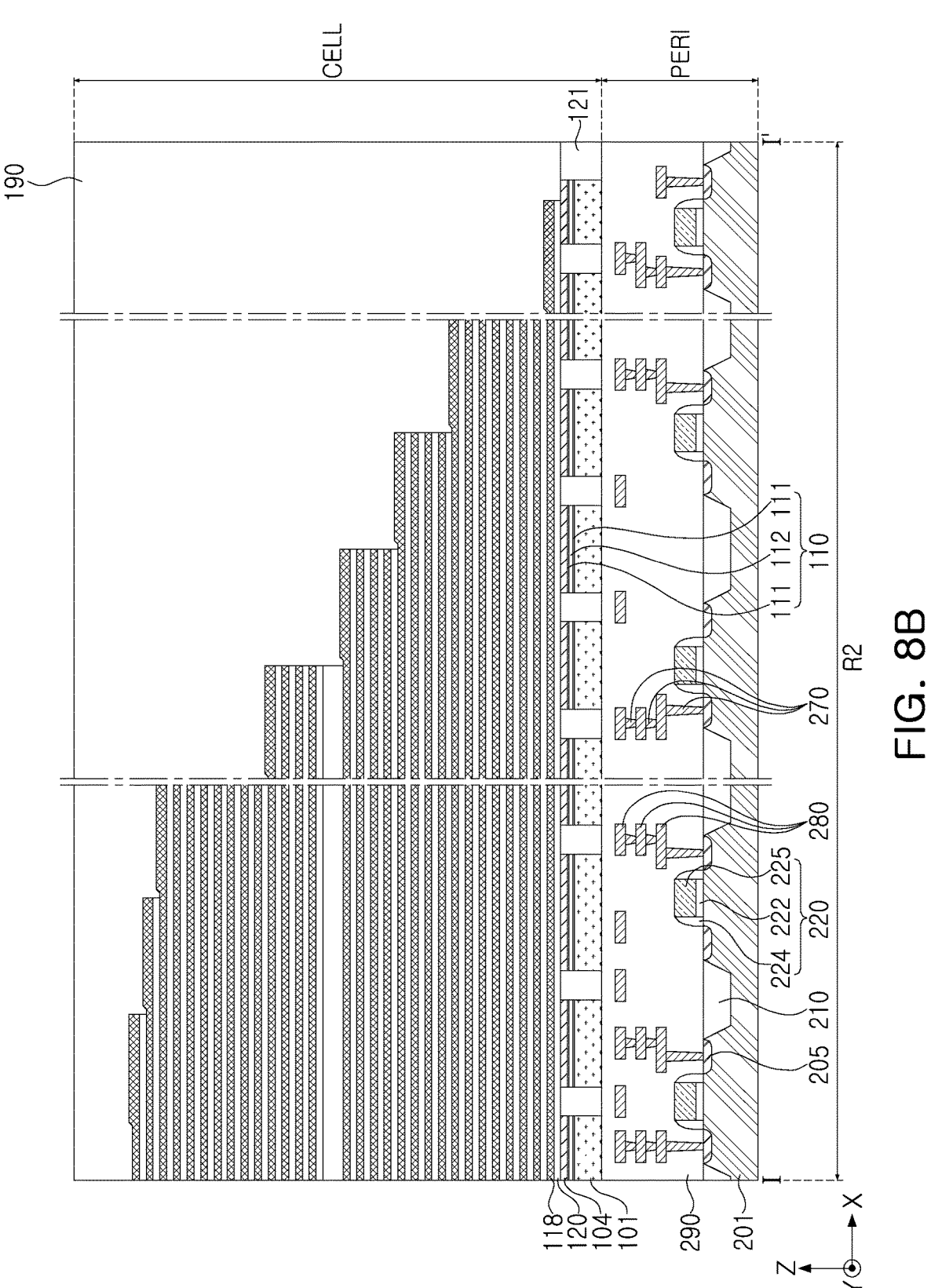

Referring to FIG. 8B, a plate layer 101 provided with a memory cell region CELL, a horizontal insulating layer 110, a second horizontal conductive layer 104, and a substrate insulating layer 121 may be formed on the peripheral circuit region PERI, and a stack structure may be formed by alternately stacking sacrificial insulating layers 118 and interlayer insulating layers 120.

The plate layer 101 may be formed on the peripheral insulating layer 290. The plate layer 101 may be formed of, for example, polycrystalline silicon, and may be formed by a CVD process. Polycrystalline silicon, forming the plate layer 101, may include impurities.

First and second horizontal insulating layers 111 and 112, forming the horizontal insulating layer 110, may be alternately stacked on the plate layer 101. A portion of the horizontal insulating layer 110 may be replaced with the first horizontal conductive layer 102 of FIG. 2B via a subsequent process. The first horizontal insulating layers 111 may include a material different from that of the second horizontal insulating layer 112. For example, the first horizontal insulating layers 111 may be formed of a material the same as that of the interlayer insulating layers 120, and the second horizontal insulating layer 112 may be formed of a material the same as that of the subsequent sacrificial insulating layers 118. A portion of the horizontal insulating layer 110 may be removed by a patterning process in some regions, for example, a second region R2.

The second horizontal conductive layer 104 may be formed on the horizontal insulating layer 110, and may be in contact with the plate layer 101 in a region in which the horizontal insulating layer 110 is removed.

The substrate insulating layer 121 may be formed to pass through the plate layer 101 in some regions including a region in which the contact plugs 170 (see FIG. 2A) are to be disposed. The substrate insulating layer 121 may be formed by removing portions of the plate layer 101, the horizontal insulating layer 110, and the second horizontal conductive layer 104, and then filling the removed portions with an insulating material. After the insulating material is filled, a planarization process may be further performed using a chemical mechanical polishing (CMP) process. Accordingly, an upper surface of the substrate insulating layer 121 and an upper surface of the second horizontal conductive layer 104 may be substantially coplanar with each other.

At least portions of the sacrificial insulating layers 118 may be replaced with gate electrodes 130 (see FIG. 2A) via a subsequent process. The sacrificial insulating layers 118 may be formed of a material different from that of the interlayer insulating layers 120, and may be formed of a material that may be etched with etch selectivity with respect to the interlayer insulating layers 120 under specific etching conditions. For example, the interlayer insulating layer 120 may be formed of at least one of silicon oxide and silicon nitride, and the sacrificial insulating layers 118 may be formed of a material different from that of the interlayer insulating layer 120 selected from among silicon, silicon oxide, silicon carbide, and silicon nitride. In example embodiments, the interlayer insulating layers 120 may not all have the same thickness. Subsequently, in the second region R2, a photolithography process and an etching process for the sacrificial insulating layers 118 may be repeatedly performed using a mask layer such that upper sacrificial insulating layers 118 extend to be shorter than lower sacrificial insulating layers 118. Accordingly, the sacrificial insulating layers 118 may form a stair-shaped step structure in predetermined units. In other words, the sacrificial insulating layers 118 may form a staircase shape. The sacrificial insulating layers 118 may be further formed on the step structure, such that uppermost sacrificial insulating layers 118 in each region may have a relatively thick thickness.

The stack structure including the sacrificial insulating layers 118 and the interlayer insulating layers 120 may include an upper stack structure and a lower stack structure. After the lower stack structure is formed and a cell region insulating layer 190 is partially formed, the upper stack structure may be formed. The cell region insulating layer 190 may cover the stair-shaped step structure formed by the sacrificial insulating layers 118. Vertical sacrificial layers, respectively passing through the lower stack structure and the upper stack structure, may be formed in regions in which the channel structures CH (see FIG. 2B) are formed. In some example embodiments, the vertical sacrificial layers may also be formed in regions in which the support structures DCH and/or the contact plugs 170 of FIG. 2A are formed.

Figure 8C:
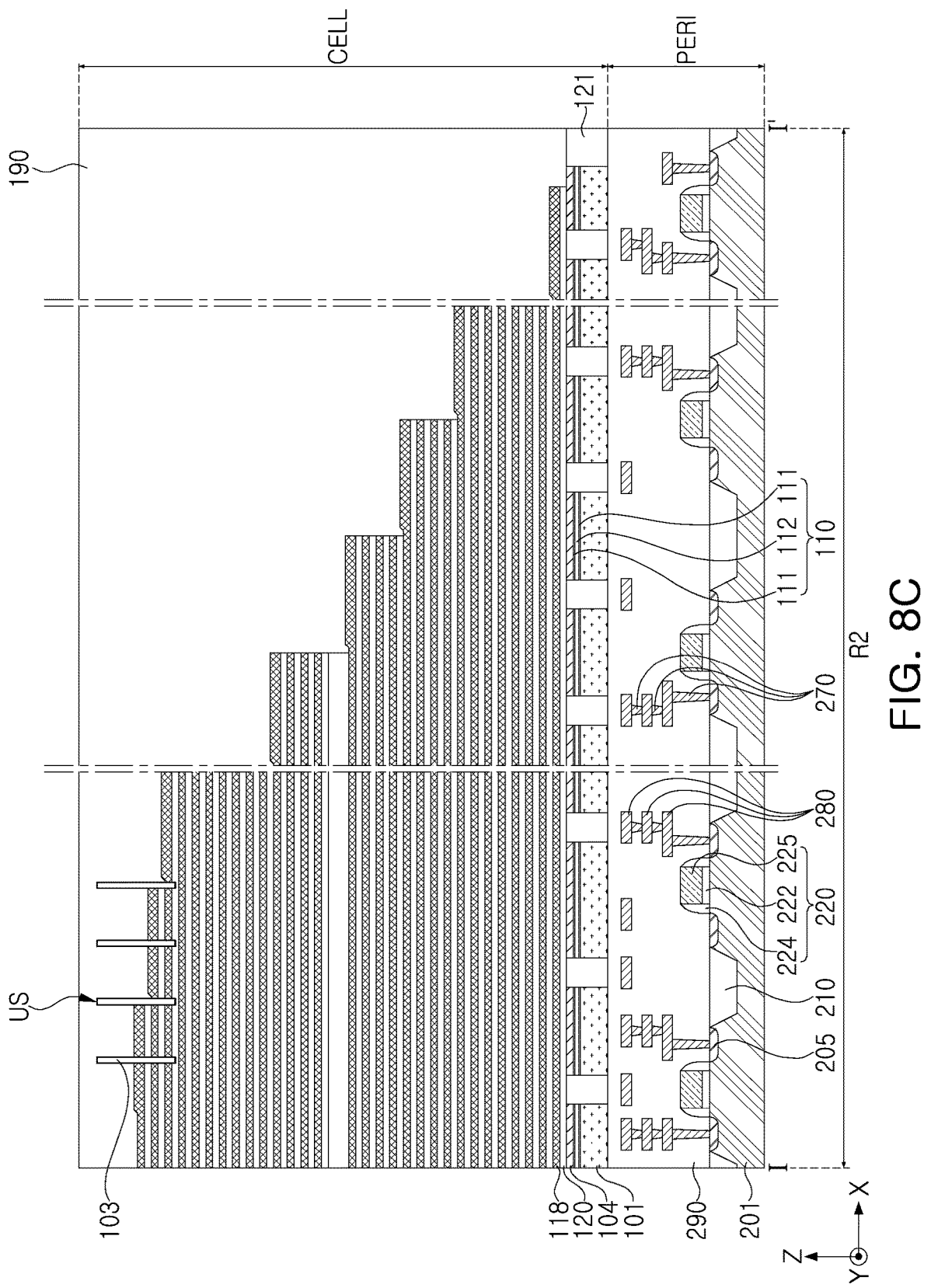

Referring to FIG. 8C, upper isolation regions US may be formed.

The upper isolation regions US may be formed by removing a predetermined number of sacrificial insulating layers 118 and interlayer insulating layers 120 from an uppermost portion, and then depositing an insulating material and forming upper isolation insulating layers 103. For example, the upper isolation regions US may be formed to pass through the sacrificial insulating layers 118 corresponding to the upper gate electrodes 130U (see FIG. 2A). Lower ends of the upper isolation regions US may be positioned on a level higher than that an upper surface of the sacrificial insulating layer 118 corresponding to an uppermost memory gate electrode 130M.

As described above with reference to FIG. 1, the upper isolation region US may be formed to include regions extending in an X-direction and regions extending in at least one direction, intersecting the X-direction. The upper isolation region US may mostly have a shape extending in the X-direction, but the present disclosure is not limited thereto.

Figure 8D:
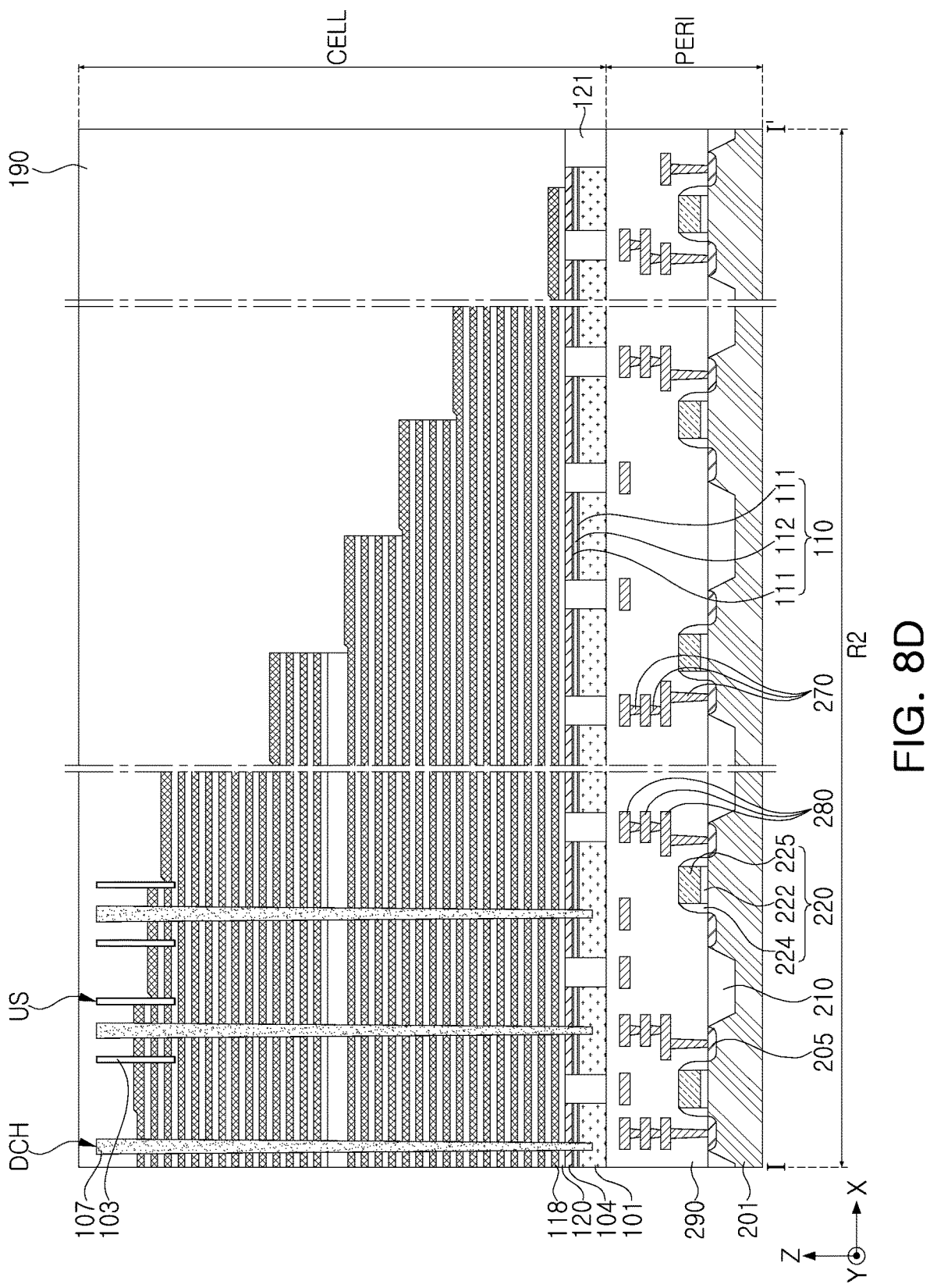

Referring to FIG. 8D, support structures DCH may be formed in the second region R2.

The support structures DCH may be formed by anisotropically etching the sacrificial insulating layers 118 and the interlayer insulating layers 120 using a mask layer to form support holes and then filling the support holes. In some example embodiments, when vertical sacrificial layers are formed in regions corresponding to the support structures DCH, the support holes may be formed by removing the vertical sacrificial layers. The support holes may be formed to recess a portion of the plate layer 101. In other words, the support holes may form recesses in the plate layer 101. The support structures DCH may be formed by depositing an insulating material in the support holes to form support insulating layers 107.

Channel structures CH (see FIG. 2B) may be formed in a first region R1. The channel structures CH may be formed by removing the vertical sacrificial layers described above with reference to FIG. 8B to form channel holes, and then sequentially forming a gate dielectric layer 145, a channel layer 140, a channel filling insulating layer 147, and channel pads as shown in FIG. 3C. The channel structures CH may be formed before the support structures DCH are formed or after the support structures DCH are formed.

Figure 8E:
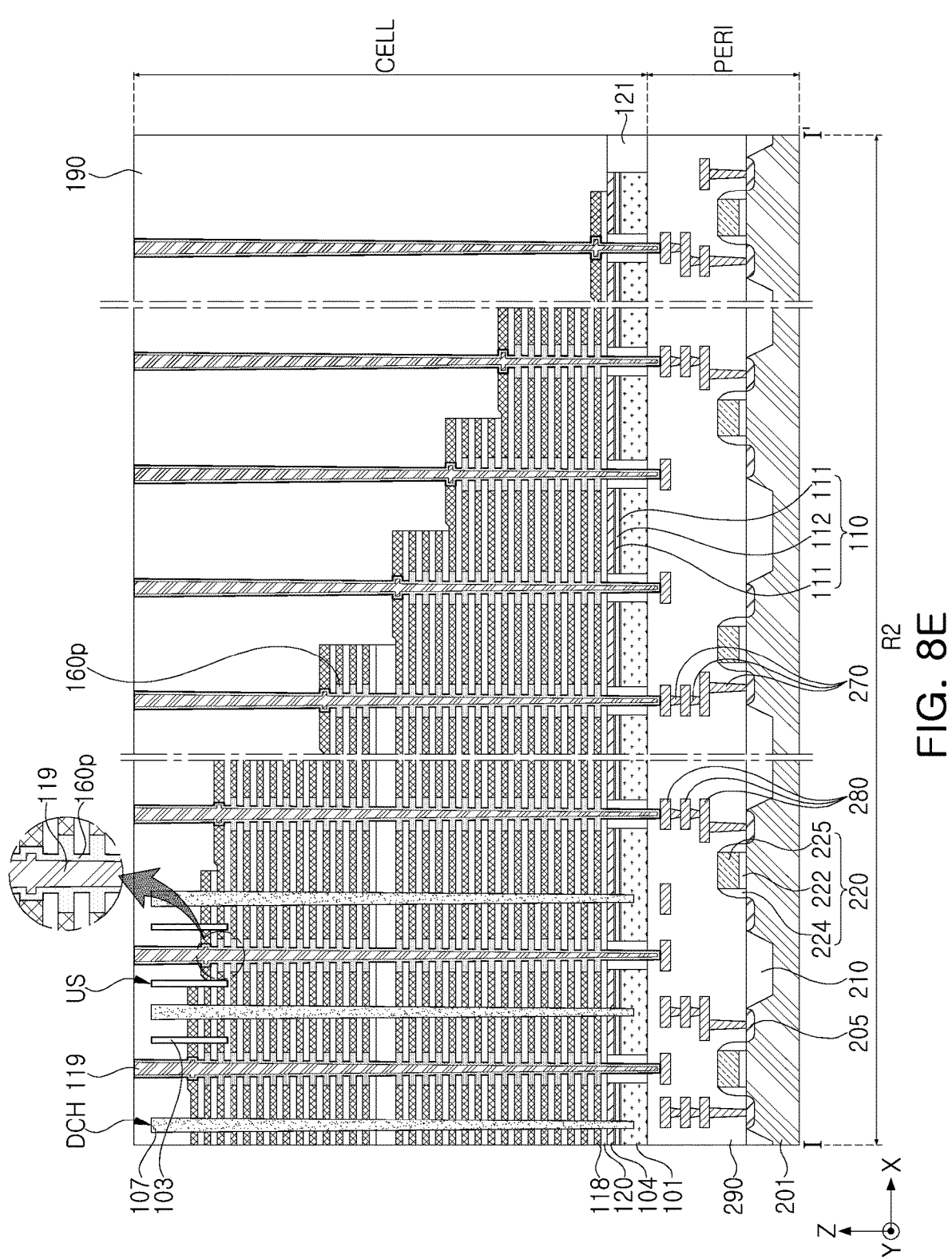

Referring to FIG. 8E, preliminary contact insulating layers 160p and vertical sacrificial layers 119 may be formed.

First, contact holes may be formed in regions in which the contact plugs 170 (see FIG. 2A) are formed, using a mask layer. In some example embodiments, when vertical sacrificial layers are formed in regions corresponding to the contact plugs 170, the contact holes may be formed by removing the vertical sacrificial layers. Subsequently, portions of the sacrificial insulating layers 118 exposed via the contact holes may be removed. The sacrificial insulating layers 118 may be removed to a predetermined length on circumferences of the contact holes to form tunnel portions. The tunnel portions may be formed to have a relatively short length in uppermost sacrificial insulating layers 118, and may be formed to have a relatively long length in sacrificial insulating layers 118 therebelow.

An insulating material may be deposited in the contact holes and the tunnel portions to form the preliminary contact insulating layers 160p. The preliminary contact insulating layers 160p may be formed on sidewalls of the contact holes, and may fill the tunnel portions. In the uppermost sacrificial insulating layers 118, the preliminary contact insulating layers 160p may not entirely fill the tunnel portions.

The vertical sacrificial layers 119 may be formed on the preliminary contact insulating layers 160p to fill the contact holes and uppermost tunnel portions. The vertical sacrificial layers 119 may include a material different from that of the preliminary contact insulating layers 160p, and may include, for example, polycrystalline silicon.

Figure 8F:
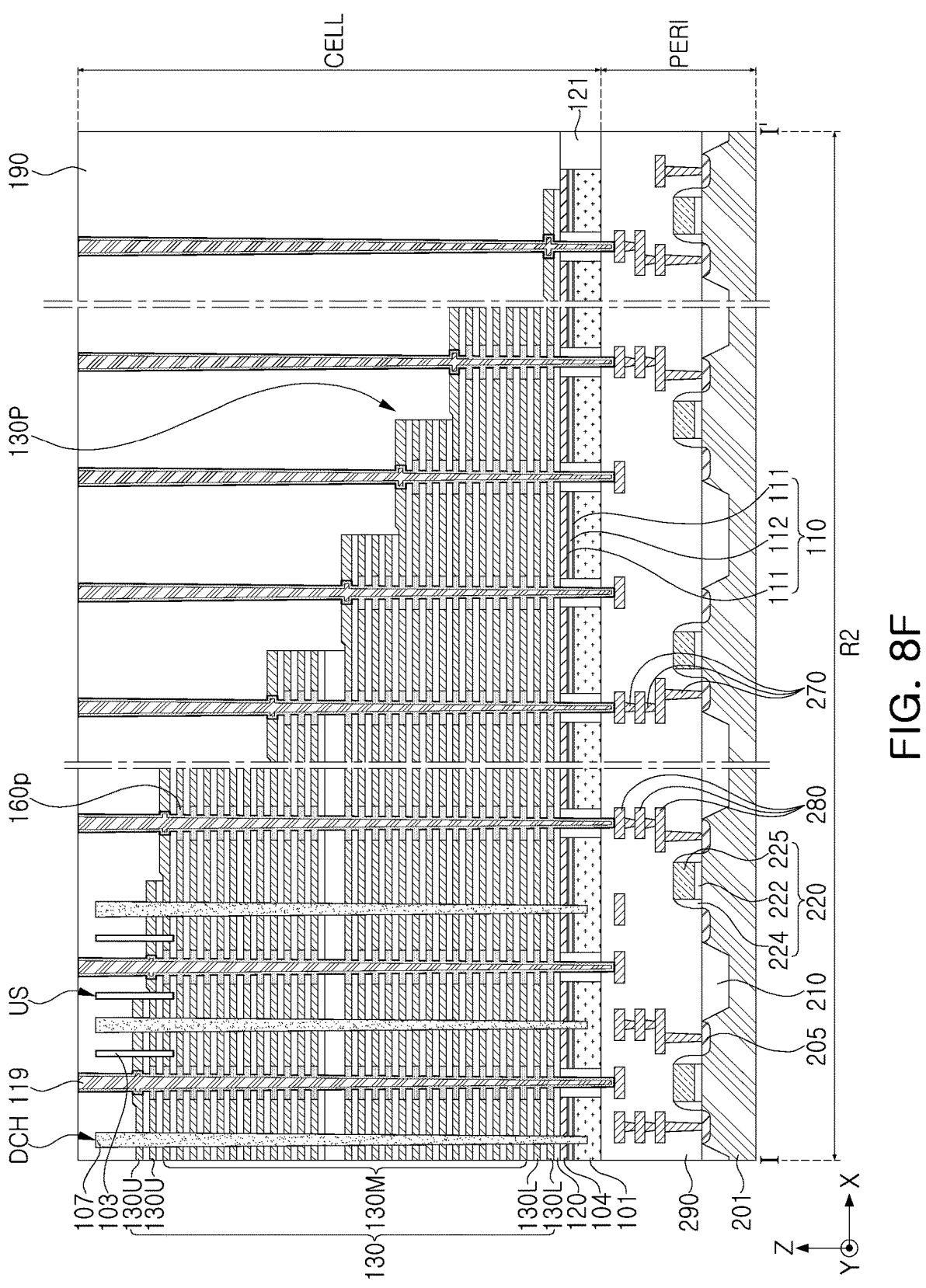

Referring to FIG. 8F, after removing the sacrificial insulating layers 118, the gate electrodes 130 may be formed.

First, openings, passing through the sacrificial insulating layers 118 and the interlayer insulating layers 120 to extend to the plate layer 101, may be formed in positions of the first and second gate separation regions MS1, MS2a, and MS2b (see FIG. 1). Subsequently, an etch-back process may be performed while forming sacrificial spacer layers in the openings, such that, in the first region R1, the horizontal insulating layer 110 may be selectively removed, and a portion of the exposed gate dielectric layer 145 may also be removed together. After the first horizontal conductive layer 102 is formed by depositing a conductive material in a region in which the horizontal insulating layer 110 is removed, the sacrificial spacer layers may be removed in the openings. In the first region R1, the first horizontal conductive layer 102 may be formed by the present process.

Subsequently, the sacrificial insulating layers 118 may be selectively formed with respect to the interlayer insulating layers 120, the second horizontal conductive layer 104, and the preliminary contact insulating layers 160p using, for example, wet etching. The gate electrodes 130 may be formed by depositing a conductive material in regions from which the sacrificial insulating layers 118 are removed. The conductive material may include metal, polycrystalline silicon, or a metal silicide material. In some example embodiments, a portion of the gate dielectric layer 145 may be formed before the gate electrodes 130 are formed. After the gate electrodes 130 are formed, the gate isolation insulating layers 105 (see FIG. 2B) may be formed in the openings formed in the first and second gate separation regions MS1, MS2*a*, and MS2*b*. In some embodiments, the upper isolation regions US may be formed after forming the gate electrodes 130.

Figure 8G:
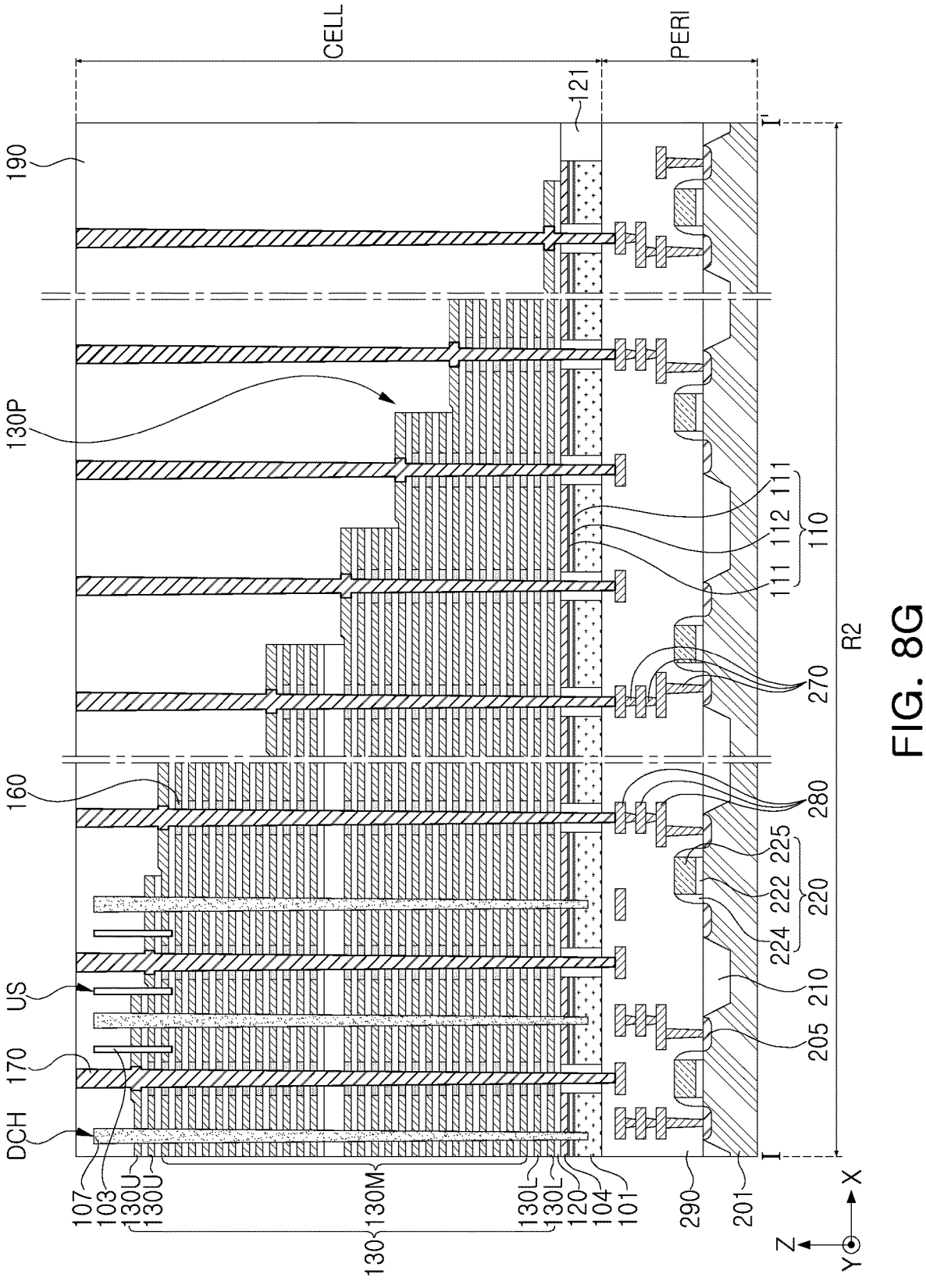

Referring to FIG. 8G, the vertical sacrificial layers 119 in the contact holes may be removed, and the contact plugs 170 may be formed.

The vertical sacrificial layers 119 may be selectively removed with respect to the interlayer insulating layers 120 and the gate electrodes 130. After the vertical sacrificial layers 119 are removed, portions of the exposed preliminary contact insulating layers 160*p* may also be removed. In this case, the preliminary contact insulating layers 160*p* may be entirely removed in the pad regions 130P, and may remain therebelow to form the contact insulating layers 160. In the pad regions 130P, when the gate dielectric layer 145 is exposed after the preliminary contact insulating layers 160*p* are removed, the gate dielectric layer 145 may also be removed to expose side surfaces of the gate electrodes 130.

The contact plugs 170 may be formed by depositing a conductive material in the contact holes. The contact plugs 170 may be formed to have horizontal extensions 170H (see FIG. 3B) horizontally extending from the pad regions 130P, and thus may be physically and electrically connected to the gate electrodes 130.

Subsequently, referring to FIGS. 2A and 2B together, the semiconductor device 100 may be manufactured by forming upper plugs 180 connected to upper ends of the contact plugs 170 and the channel structures CH.

Figure 9:
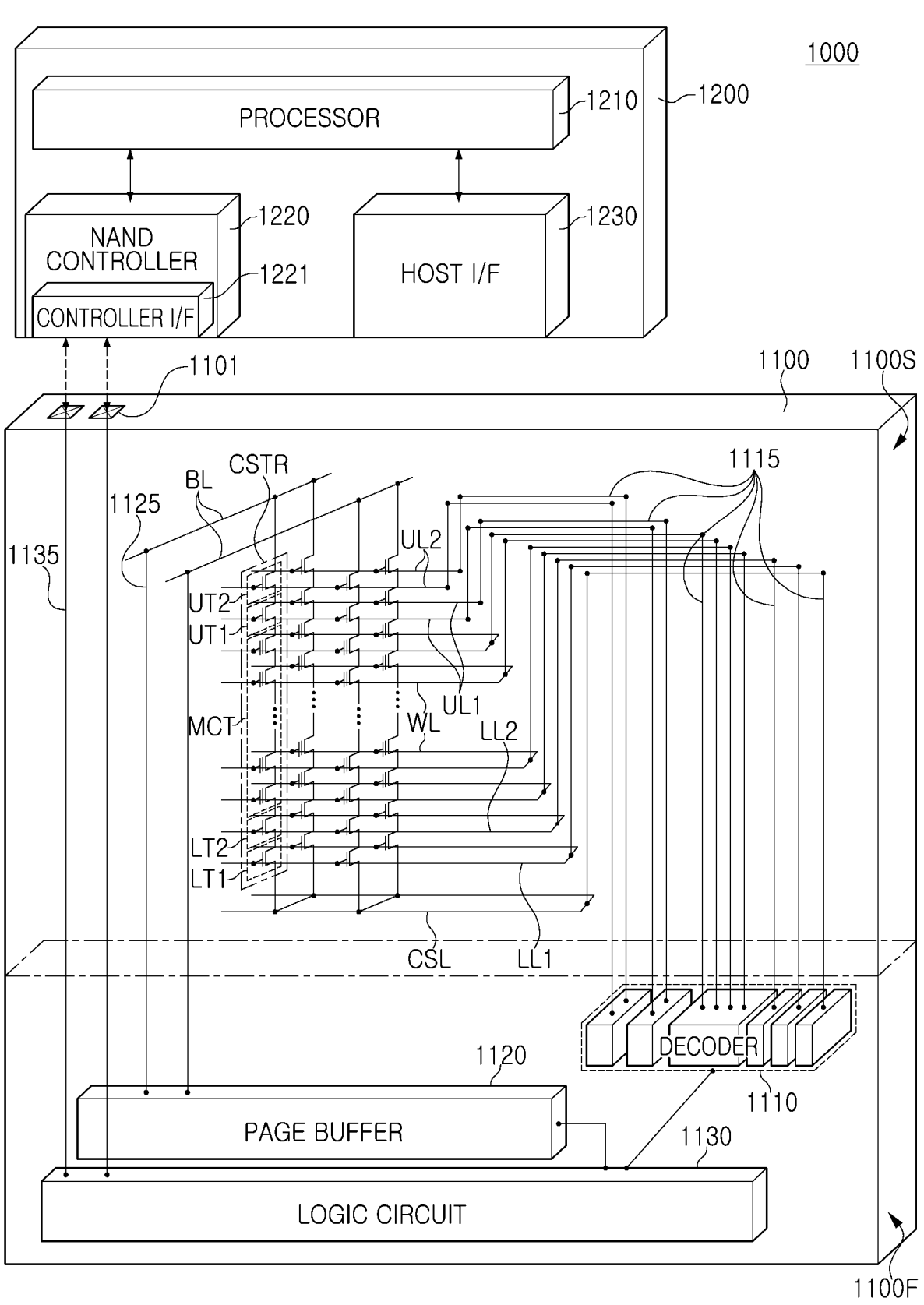
FIG. 9 is a schematic diagram illustrating a data storage system including a semiconductor device according to example embodiments of the present disclosure.

FIG. 9 is a schematic diagram illustrating a data storage system including a semiconductor device according to example embodiments.

Referring to FIG. 9, a data storage system 1000 may include a semiconductor device 1100 and a controller 1200 electrically connected to the semiconductor device 1100. The data storage system 1000 may be a storage device including one or a plurality of semiconductor devices 1100 or an electronic device including the storage device. For example, the data storage system 1000 may be a solid-state drive device (SSD) including one or a plurality of semiconductor devices 1100, a universal serial bus (USB), a computing system, a medical device, or a communication device.

The semiconductor device 1100 may be a non-volatile memory device, and may be, for example, the NAND flash memory device described above with reference to FIGS. 1 to 7. The semiconductor device 1100 may include a first structure 1100F and a second structure 1100S on the first structure 1100F. In example embodiments, the first structure 1100F may be disposed next to the second structure 1100S. For example, the first structure 1100F and the second structure 1100S may be side-by-side. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. In some example embodiments, the number of lower transistors LT1 and LT2 and the number of upper transistors UT1 and UT2 may be modified in various manners.

In example embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 connected in series. The upper transistors UT1 and UT2 may include a string selection transistor UT1 and an upper erase control transistor UT2 connected in series. At least one of the lower erase control transistor LT1 and the upper erase control transistor UT2 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 via first connection interconnections 1115 extending from the first structure 1100F to the second structure 1100S. The bit lines BL may be electrically connected to the page buffer 1120 via second connection interconnections 1125 extending from the interior of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 via an input/output pad 1101 electrically connected to the logic circuit 1130. The input/output pad 1101 may be electrically connected to the logic circuit 1130 via an input/output connection interconnection 1135 extending from the interior of the first structure 1100F to the second structure 1100S.

The controller 1200 may include a processor 1210, a NAND controller 1220, and a host interface 1230. In some example embodiments, the data storage system 1000 may include a plurality of semiconductor devices 1100. In this case, the controller 1200 may control the plurality of semiconductor devices 1100.

The processor 1210 may control an overall operation of the data storage system 1000 including the controller 1200. The processor 1210 may operate according to predetermined firmware, and may access the semiconductor device 1100 by controlling the NAND controller 1220. The NAND controller 1220 may include a controller interface 1221 processing communication with the semiconductor device 1100. The controller interface 1221 may be connected to the input/output pad 1101 of the semiconductor device 1100. A control instruction for controlling the semiconductor device 1100, data to be written in the memory cell transistors MCT of the semiconductor device 1100, and data to be read from the memory cell transistors MCT of the semiconductor device 1100 may be transmitted via the controller interface 1221. The host interface 1230 may provide a communication function between the data storage system 1000 and an external host. When a control instruction is received from the external host via the host interface 1230, the processor 1210 may control the semiconductor device 1100 in response to the control instruction.

Figure 10:
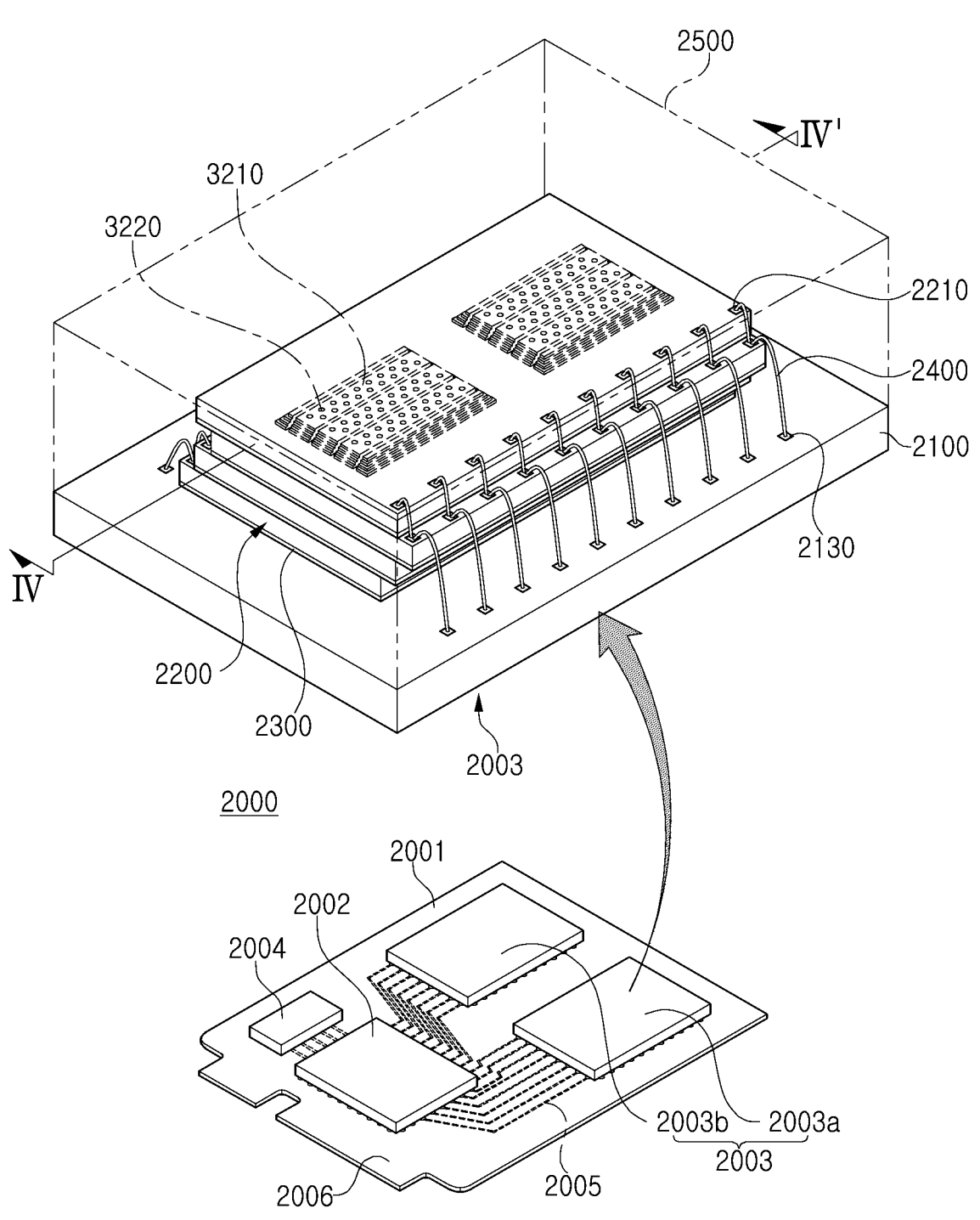
FIG. 10 is a schematic perspective view of a data storage system including a semiconductor device according to an example embodiment of the present disclosure.

FIG. 10 is a schematic perspective view of a data storage system including a semiconductor device according to an example embodiment.

Referring to FIG. 10, a data storage system 2000 according to an example embodiment of the present disclosure may include a main substrate 2001, a controller 2002 mounted on the main substrate 2001, one or more semiconductor packages 2003, and a DRAM 2004. The semiconductor packages 2003 and the DRAM 2004 may be connected to the controller 2002 via interconnection patterns 2005 formed on the main substrate 2001.

The main board 2001 may include a connector 2006 including a plurality of pins to be coupled to an external host. The number and arrangement of the plurality of pins in the connector 2006 may vary depending on a communication interface between the data storage system 2000 and the external host. In example embodiments, the data storage system 2000 may communicate with the external host according to one of interfaces such as universal flash storage (UFS), peripheral component interconnect express (PCI-Express), serial advanced technology attachment (SATA), M-Phy for universal serial bus (USB), and the like. In example embodiments, the data storage system 2000 may be operated by power supplied from the external host via the connector 2006. The data storage system 2000 may further include a power management integrated circuit (PMIC) distributing, to the controller 2002 and a semiconductor package 2003, power supplied from the external host.

The controller 2002 may write data in the semiconductor package 2003 or read data from the semiconductor package 2003, and may improve operating speed of the data storage system 2000.

The DRAM 2004 may be a buffer memory for alleviating a speed difference between the semiconductor package 2003, a data storage space, and the external host. The DRAM 2004, included in the data storage system 2000, may also operate as a type of cache memory, and may provide a space for temporarily storing data in a control operation on the semiconductor package 2003. When the DRAM 2004 is included in the data storage system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 9. Each of the semiconductor chips 2200 may include gate stack structures 3210 and channel structures 3220. Each of the semiconductor chips 2200 may include the semiconductor device described above with reference to FIGS. 1 to 7.

In example embodiments, the connection structure 2400 may be a bonding wire electrically connecting the input/output pad 2210 and the package upper pads 2130 to each other. Accordingly, in each of the first and second semiconductor packages 2003a and 2003b, the semiconductor chips 2200 may be electrically connected to each other using a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other by a connection structure including a through-silicon via (TSV) instead of the connection structure 2400 using the bonding wire method.

In example embodiments, the controller 2002 and the semiconductor chips 2200 may be included in one package. In an example embodiment, the controller 2002 and the semiconductor chips 2200 may be mounted on an interposer substrate, different from the main substrate 2001, and the controller 2002 and the semiconductor chips may be connected to each other by an interconnection formed on the interposer substrate 2200.

Figure 11:
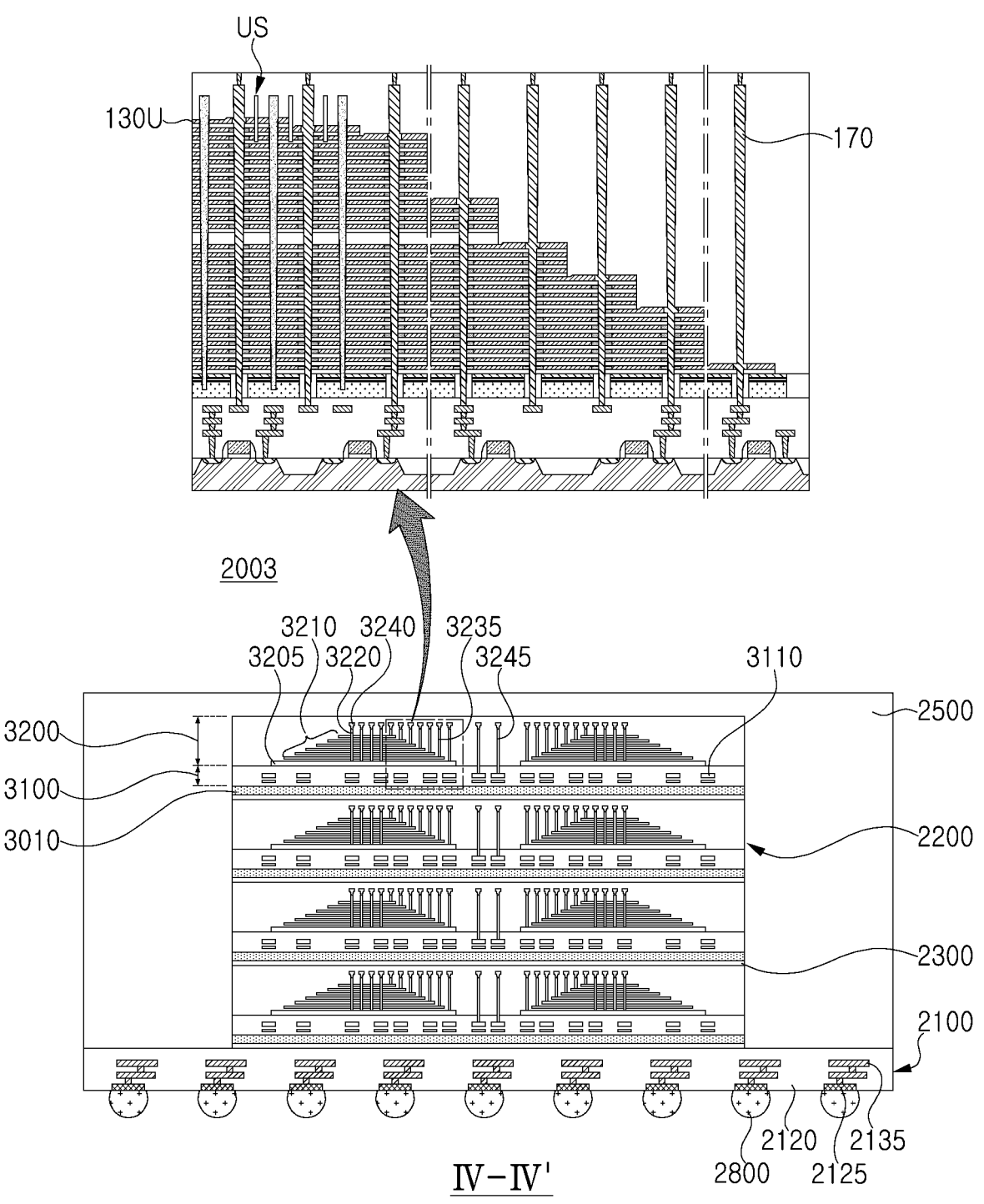
FIG. 11 is a schematic cross-sectional view of a semiconductor package according to an example embodiment of the present disclosure.

FIG. 11 is a schematic cross-sectional view of a semiconductor package according to an example embodiment. FIG. 11 illustrates an example embodiment of the semiconductor package 2003 of FIG. 10, and schematically illustrates a region obtained by cutting the semiconductor package 2003 of FIG. 10 along line IV-IV'.

Referring to FIG. 11, in the semiconductor package 2003, the package substrate 2100 may be a printed circuit board. The package substrate 2100 may include a package substrate body portion 2120, the package upper pads 2130 (see FIG. 10) disposed on the upper surface of the package substrate body 2120, lower pads 2125 disposed on a lower surface of the package substrate body portion 2120 and exposed via the lower surface, and internal interconnections 2135 electrically connecting the upper pads 2130 and the lower pads 2125 to each other in the package substrate body portion 2120. The lower pads 2125 may be connected to the interconnection patterns 2005 of the main substrate 2001 of the data storage system 2000 via conductive connection portions 2800, as illustrated in FIG. 10.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 passing through the gate stack structure 3210, bit lines 3240 electrically connected to the channel structures 3220, and contact plugs 3235 electrically connected to the word lines WL (see FIG. 9) of the gate stack structure 3210. As described above with reference to FIGS. 1 to 7, each of the semiconductor chips 2200 may further include upper isolation regions US extending in a direction, intersecting an X-direction. The upper gate electrodes 130U, isolated from each other by the upper isolation regions US, may be connected to through-type contact plugs 170, respectively.

Each of the semiconductor chips 2200 may include a through-interconnection 3245 electrically connected to the peripheral interconnections 3110 of the first structure 3100 and extending into the second structure 3200. The through-interconnection 3245 may be disposed on the outside of the gate stack structure 3210, and may further be disposed to pass through the gate stack structure 3210. Each of the semiconductor chips 2200 may further include the input/output pad 2210 (see FIG. 10) electrically connected to the peripheral interconnections 3110 of the first structure 3100.

The arrangement of upper isolation regions and contact plugs according to example embodiments may be optimized to simplify an interconnection structure, thereby providing a semiconductor device having improved mass productivity.

While example embodiments have been shown and described above, it will be apparent to those skilled in the art that modifications, variations, and combinations of the embodiments could be made without departing from the scope of the present disclosure as set forth by the appended claims.

What is claimed is:

1. A semiconductor device comprising:
   a first semiconductor structure including a substrate, circuit elements on the substrate, and circuit interconnection lines connected to the circuit elements; and
   a second semiconductor structure on the first semiconductor structure, the second semiconductor structure having first and second regions,
   wherein the second semiconductor structure includes:
   a plate layer;
   gate electrodes stacked on the plate layer and spaced apart from each other in a first direction, perpendicular to an upper surface of the plate layer, the gate electrodes including a lower gate electrode, memory gate electrodes, and an upper gate electrode sequentially stacked, and the gate electrodes having pad regions extending to different lengths in a second direction, perpendicular to the first direction, in the second region such that upper surfaces of the pad regions are exposed;
   channel structures, in the first region, the channel structures passing through the gate electrodes, extending in the first direction, and each including a channel layer;
   gate separation regions, in the first and second regions, the gate separation regions passing through the gate electrodes and extending in the second direction;
   first and second upper isolation regions on the memory gate electrodes, the first and second upper isolation regions dividing the upper gate electrode into first, second and third sub-gate electrodes between adjacent gate separation regions, and extending in the second direction; and
   contact plugs, in the second region, the contact plugs extending in the first direction through the pad regions of the gate electrodes, and connected to portions of the circuit interconnection lines,
   each of the first and second upper isolation regions has a region extending in a third direction, intersecting the second direction, and
   the first sub-gate electrode has a first pad region having a first width and a second pad region having a second width narrower than the first width in a fourth direction, perpendicular to the second direction, and the first sub-gate electrode is connected to one of the contact plugs in the first pad region.

2. The semiconductor device of claim 1, wherein the first and second upper isolation regions have shapes symmetrical to each other in the fourth direction.

3. The semiconductor device of claim 1, wherein the second sub-gate electrode has a third pad region parallel to the first pad region in the fourth direction and a fourth pad region parallel to the second pad region in the fourth direction, and the second sub-gate electrode is connected to one of the contact plugs in the fourth pad region.

4. The semiconductor device of claim 3, wherein, in the second sub-gate electrode, the third pad region has a third width in the fourth direction, and the fourth pad region has a fourth width wider than the third width and the first width in the fourth direction.

5. The semiconductor device of claim 1, wherein the first and second upper isolation regions extend in the second direction in the first region, and extend in the second direction and the third direction in the second region, adjacent to the first region.

6. The semiconductor device of claim 1, wherein the third direction is a direction the same as the fourth direction or a direction between the second direction and the fourth direction.

7. The semiconductor device of claim 1, wherein the memory gate electrodes and the lower gate electrode horizontally extend below the first and second upper isolation regions.

8. The semiconductor device of claim 1, wherein
   the first, second and third sub-gate electrodes are respectively connected to first, second and third contact plugs, among the contact plugs, and
   at least portions of the first, second and third contact plugs do not overlap each other in the fourth direction.

9. The semiconductor device of claim 1, wherein each of the contact plugs includes a vertical extension extending in the first direction and a horizontal extension horizontally extending from the vertical extension and in contact with one of the pad regions.

10. The semiconductor device of claim 1, wherein the second semiconductor structure further includes contact insulating layers on levels the same as levels of the gate electrodes and at side surfaces of the contact plugs.

11. The semiconductor device of claim 1, wherein the second semiconductor structure further includes support structures passing through the gate electrodes and portions of the first and second upper isolation regions around the contact plugs.

12. The semiconductor device of claim 11, wherein at least one of the support structures passes through the second pad region.

13. The semiconductor device of claim 1, wherein the upper gate electrode forms a string selection transistor.

14. A semiconductor device comprising:
   a first semiconductor structure including a substrate, circuit elements on the substrate, and circuit interconnection lines connected to the circuit elements; and
   a second semiconductor structure on the first semiconductor structure and having first and second regions,
   wherein the second semiconductor structure includes:
   a plate layer;
   gate electrodes stacked on the plate layer and spaced apart from each other in a first direction, perpendicular to an upper surface of the plate layer, and having pad regions extending to different lengths in a second direction, perpendicular to the first direction, in the second region such that upper surfaces of the pad regions are exposed;
   gate separation regions, in the first and second regions, passing through the gate electrodes and extending in the second direction;

an upper isolation region on portions of the gate electrodes, dividing an uppermost gate electrode, among the gate electrodes, into first and second sub-gate electrodes between the gate separation regions, and extending in the second direction, and contact plugs, in the second region, extending in the first direction through the gate electrodes and connected to portions of the circuit interconnection lines, the upper isolation region has a region extending in a third direction, intersecting the second direction, the first sub-gate electrode has first and second pad regions having different sizes, and the second sub-gate electrode has third and fourth pad regions having different sizes, and the first sub-gate electrode is connected to one of the contact plugs in the first pad region, and the second sub-gate electrode is connected to one of the contact plugs in the fourth pad region.

15. The semiconductor device of claim 14, wherein the first pad region is parallel to the third pad region, and the second pad region is parallel to the fourth pad region, in a fourth direction, perpendicular to the second direction.

16. The semiconductor device of claim 14, wherein a size of the first pad region is larger than a size of the second pad region, and a size of the third pad region is smaller than a size of the fourth pad region.

17. The semiconductor device of claim 14, wherein a size of the first pad region is different from a size of the fourth pad region.

18. The semiconductor device of claim 14, wherein a lower end of the upper isolation region is on a level between two gate electrodes, vertically adjacent to each other, among the gate electrodes.

19. A data storage system comprising:

a semiconductor storage device including a first semiconductor structure including circuit elements, a second semiconductor structure including channel structures and having first and second regions, and an input/output pad electrically connected to the circuit elements; and a controller electrically connected to the semiconductor storage device via the input/output pad and configured to control the semiconductor storage device, wherein the second semiconductor structure further includes:

gate electrodes stacked and spaced apart from each other in a first direction, the gate electrodes including a lower gate electrode, memory gate electrodes, and an upper gate electrode sequentially stacked, and having pad regions extending to different lengths in a second direction, perpendicular to the first direction, in the second region such that upper surfaces of the pad regions are exposed;

gate separation regions, in the first and second regions, passing through the gate electrodes and extending in the second direction;

first and second upper isolation regions on the memory gate electrodes, dividing the upper gate electrode into first, second and third sub-gate electrodes between adjacent gate separation regions, and extending in the second direction; and contact plugs, in the second region, extending in the first direction through the pad regions of the gate electrodes and connected to portions of the circuit interconnection lines, and the first and second upper isolation regions have regions extending in a third direction, intersecting the second direction, and being symmetrical to each other in a fourth direction, perpendicular to the second direction.

20. The data storage system of claim 19, wherein the first sub-gate electrode has a first pad region having a first width and a second pad region having a second width narrower than the first width in the fourth direction, and is connected to one of the contact plugs in the first pad region.

* * * * *